United States Patent
Higashitani et al.

(10) Patent No.: US 9,159,406 B2
(45) Date of Patent: Oct. 13, 2015

(54) SINGLE-LEVEL CELL ENDURANCE IMPROVEMENT WITH PRE-DEFINED BLOCKS

(71) Applicant: SanDisk Technologies Inc., Plano, TX (US)

(72) Inventors: Masaaki Higashitani, Cupertino, CA (US); Mohan Dunga, Santa Clara, CA (US); Jiahui Yuan, Fremont, CA (US)

(73) Assignee: SanDisk Technologies Inc., Plano, TX (US)

( * ) Notice: Subject to any disclaimer, the term of this patent is extended or adjusted under 35 U.S.C. 154(b) by 137 days.

(21) Appl. No.: 13/668,160

(22) Filed: Nov. 2, 2012

(65) Prior Publication Data
US 2014/0126286 A1  May 8, 2014

(51) Int. Cl.
*G11C 11/34* (2006.01)
*G11C 16/04* (2006.01)
*G11C 11/56* (2006.01)
*H01L 21/28* (2006.01)
*H01L 27/115* (2006.01)

(52) U.S. Cl.
CPC ...... *G11C 11/5628* (2013.01); *H01L 21/28273* (2013.01); *H01L 27/11521* (2013.01); *H01L 27/11524* (2013.01); *G11C 2211/5641* (2013.01)

(58) Field of Classification Search
None
See application file for complete search history.

(56) References Cited

U.S. PATENT DOCUMENTS

| | | |
|---|---|---|
| 5,999,452 A | 12/1999 | Chen et al. |
| 6,266,275 B1 | 7/2001 | Chen et al. |
| 7,177,191 B2 | 2/2007 | Fasoli et al. |
| 2002/0039311 A1* | 4/2002 | Takeuchi et al. ......... 365/185.09 |
| 2002/0190343 A1 | 12/2002 | Jones et al. |
| 2006/0050598 A1* | 3/2006 | Rinerson et al. ............. 365/232 |
| 2007/0004148 A1 | 1/2007 | Yang |
| 2008/0112238 A1* | 5/2008 | Kim et al. ..................... 365/200 |
| 2008/0273389 A1* | 11/2008 | Aritome et al. .......... 365/185.17 |
| 2011/0275186 A1 | 11/2011 | Ito et al. |

OTHER PUBLICATIONS

Belgal et al., "A new reliability model for post-cycling charge retention of flash memoreis," 2002 IEEE International Reliability Physics Symposium Proceedings, 40th Annual, Dallax, TX, Apr. 7-11, 2002, 14 pages.

Kim et al., "The future prospect of nonvolatile memory," VLSI Technology, 2005 IEEE International Symposium on VLSI-TSA, Hsinchu, Taiwan, Apr. 25-27, 2005, Piscataway, NJ, 8 pages.

(Continued)

*Primary Examiner* — Kretelia Graham
(74) *Attorney, Agent, or Firm* — Vierra Magen Marcus LLP

(57) ABSTRACT

Techniques are disclosed for SLC blocks having different characteristics than MLC blocks such that SLC blocks will have high endurance and MLC blocks will have high reliability. A thinner tunnel oxide may be used for memory cells in SLC blocks than for memory cells in MLC blocks. A thinner tunnel oxide in SLC blocks may allow a lower program voltage to be used, which may improve endurance. A thicker tunnel oxide in MLC blocks may improve data retention. A thinner IPD may be used for memory cells in SLC blocks than for memory cells in MLC blocks. A thinner IPD may provide a higher coupling ratio, which may allow a lower program voltage. A lower program voltage in SLC blocks can improve endurance. A thicker IPD in MLC blocks can prevent or reduce read disturb. SLC blocks may have a different number of data word lines than MLC blocks.

13 Claims, 22 Drawing Sheets

(56) References Cited

OTHER PUBLICATIONS

Mori et al., "Thickness Scaling Limitation Factors of ONO Interpoly Dielectric for Nonvolatile Memory Devices," IEEE Transactions on Electron Devices, IEEE Service Center, Piscataway, NJ, vol. 43, No. 1, Jan. 1996, 8 pages.

PCT International Search Report and Written Opinion of the International Searching Authority dated Feb. 24, 2014, PCT Patent Application No. PCT/US2013/068036, filed Nov. 1, 2013, 13 pages.

* cited by examiner

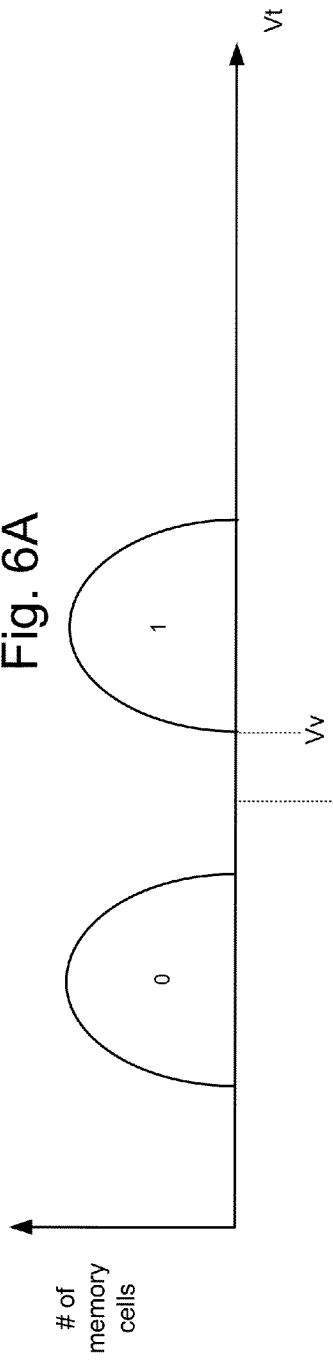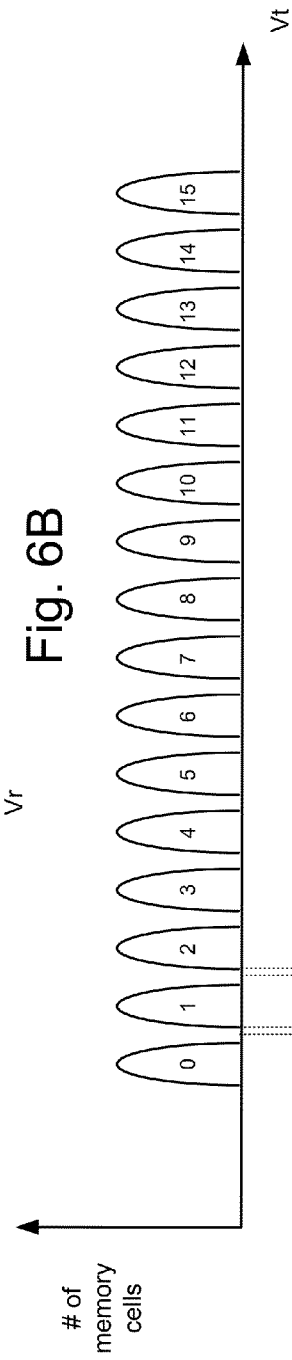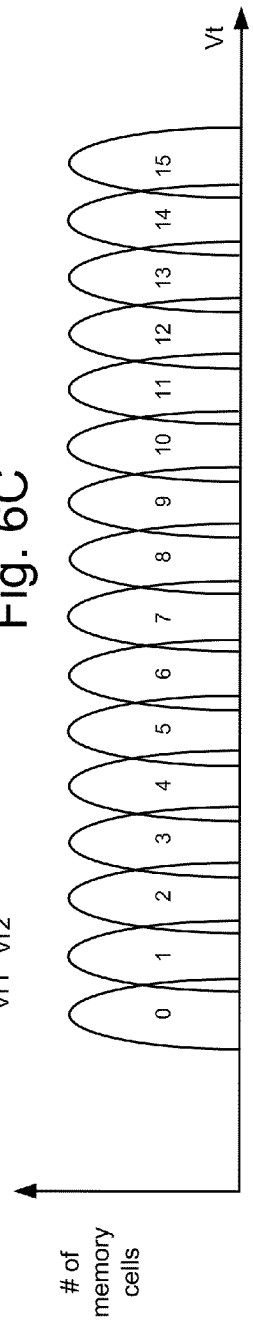

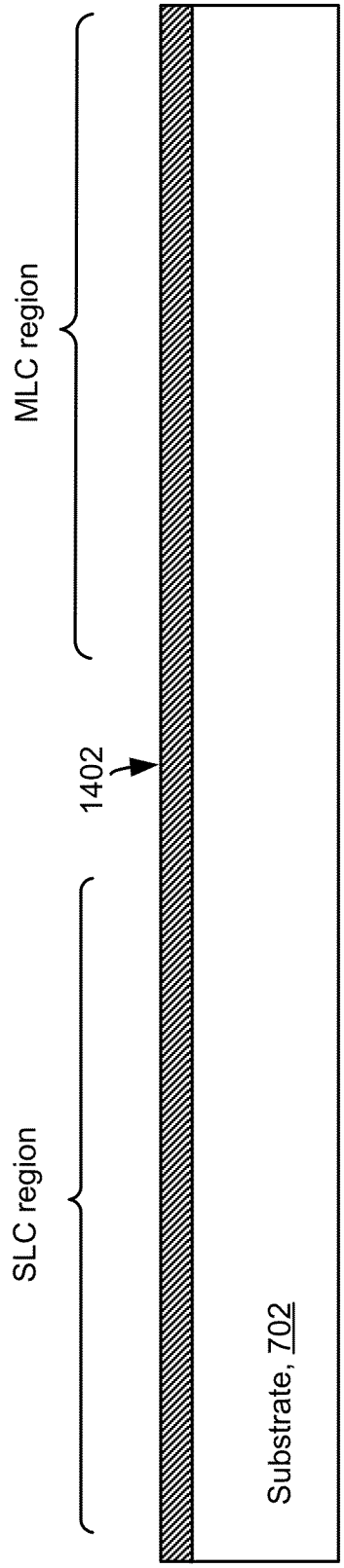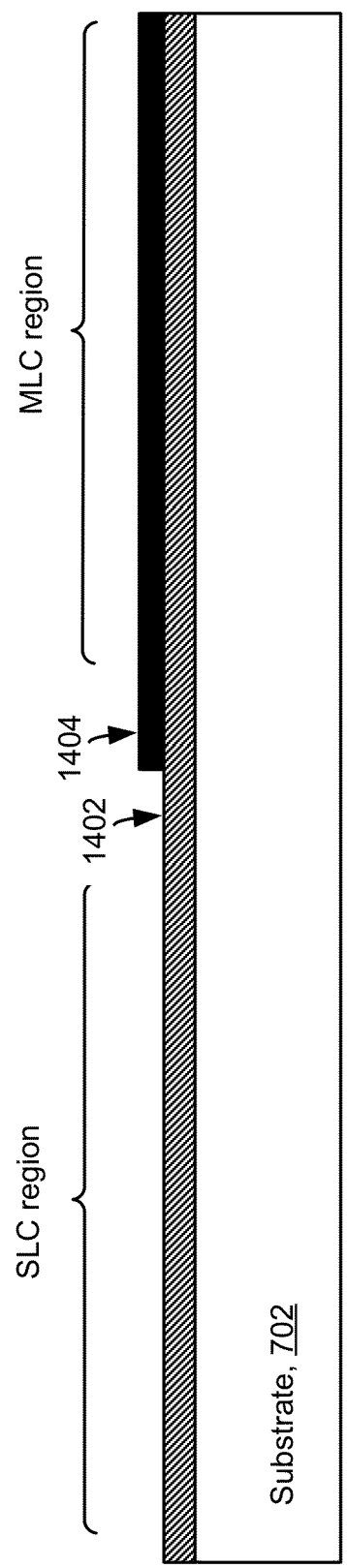

SINGLE-LEVEL CELL ENDURANCE IMPROVEMENT WITH PRE-DEFINED BLOCKS

BACKGROUND

1. Field

The present disclosure relates to non-volatile memory.

2. Description of the Related Art

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage ($V_{TH}$) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the memory element can be erased/programmed between two states, e.g., an erased state and a programmed state. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

Some flash memory devices operate as both binary and multi-states. For example, some memory cells are used to store one bit of data ("single-level cell or SLC blocks") and other memory cells are used to store multiple bits per cell ("multi-level cell or MLC blocks"). For some devices, the SLC blocks and MLC blocks are part of the same integrated circuit, and may even be part of the same memory array. The SLC blocks may be used for short term storage of data, whereas the MLC blocks may be used for long term data storage. Thus, the SLC blocks may be erased/programmed many more times over the life of the device than MLC blocks. Therefore, endurance may be a more significant problem for SLC blocks than for MLC blocks.

On the other hand, because the MLC blocks have more states than SLC blocks, the states are packed in more closely, which leads to greater reliability problem with MLC blocks. An example of a reliability problem is data retention. After the MLC block is programmed, the charges in the floating gate can leak out as time passes by. This causes the high threshold voltage states to shift down to lower threshold voltage. Because MLC blocks have more states and, therefore, have less separation between the threshold voltage of one state and the next, data retention is a greater problem for MLC blocks then for SLC blocks.

However, it can be difficult to form SLC blocks and MLC blocks that have desired characteristics for each type of block on the same integrated circuit. For example, the process of forming the integrated circuit can be tailored to achieve high reliability for MLC blocks, but this may come at the expense of lower endurance for SLC blocks.

BRIEF DESCRIPTION OF THE DRAWINGS

FIGS. 6A-6C depict example threshold voltage distributions.

FIGS. 14A-14D depict results after various steps of one embodiment of the process of FIG. 13.

DETAILED DESCRIPTION

Techniques are disclosed herein for SLC blocks with different physical characteristics than MLC blocks such that the SLC blocks may have high endurance and the MLC blocks may have high reliability. Techniques are disclosed herein for using different process steps to form SLC blocks than MLC blocks such that the SLC blocks may have high endurance and the MLC blocks may have high reliability.

In one embodiment, a thinner tunnel oxide is used for memory cells in SLC blocks than for memory cells in MLC blocks. A thinner tunnel oxide in the SLC blocks may allow a lower program voltage and lower erase voltage to be used, which may improve endurance. A thicker tunnel oxide in the MLC blocks may improve data retention.

In one embodiment, a thinner inter-gate dielectric is used for memory cells in SLC blocks than for memory cells in MLC blocks. A thinner inter-gate dielectric in the SLC blocks may provide for a higher coupling ratio, which may allow a lower program voltage to be used. Using a lower program voltage in the SLC blocks can improve endurance. A thicker inter-gate dielectric in the MLC blocks can help prevent or reduce read disturb and improve data retention and program saturation. Program saturation may be more critical for MLC blocks as the states are typically programmed to higher threshold voltages compared to SLC blocks.

In one embodiment, SLC blocks have a different number of data word lines than MLC blocks. In one embodiment, an SLC block has exactly "x" data word and an MLC block has exactly "y" data word lines. A managing circuit may store "n" bits in each memory cell in an MLC block, wherein "n" is an integer greater than one, and wherein x=y*n. In one embodiment, an SLC block has twice as many data word lines as an MLC block. This may allow for all of the data in an SLC block to be transferred to one MLC block that stores two bits per memory cell. In one embodiment, an SLC block has three times as many data word lines as an MLC block. This may allow for all of the data in an SLC block to be transferred to one MLC block that stores three bits per memory cell. In one embodiment, NAND strings in SLC blocks have a different number of data memory cells than NAND strings in MLC blocks.

In one embodiment, a shorter floating gate is used for memory cells in SLC blocks than for memory cells in MLC blocks.

Figure 1:
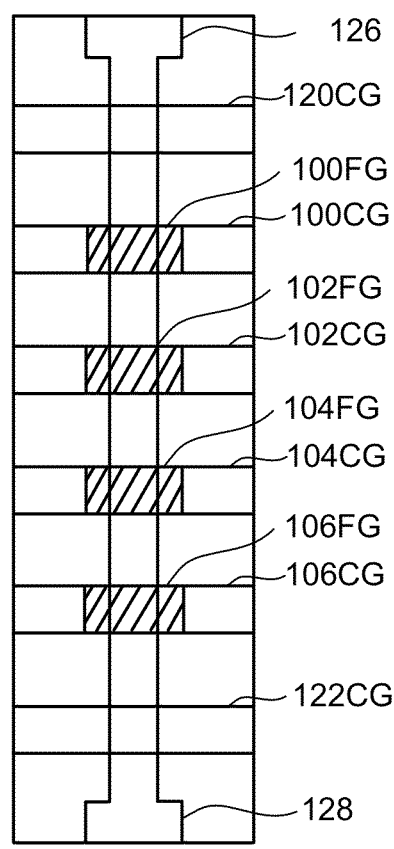
FIG. 1 is a top view of a NAND string.

The techniques described herein are applicable to wide range of memory arrays having memory cells for storing a single bit per cell and memory cells for storing multiple bits per cell. The following is one example NAND architecture. However, techniques described herein are not limited to this example. One example of a flash memory system uses the NAND structure, which includes arranging multiple floating gate transistors in series between two select gates. The transistors in series and the select gates are referred to as a NAND string. FIG. 1 is a top view showing one NAND string. The NAND string depicted in FIG. 1 includes four transistors 100, 102, 104 and 106 in series and sandwiched between a first (or drain side) select gate 120 and a second (or source side) select gate 122. Select gate 120 connects the NAND string to a bit line via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

A typical architecture for a flash memory system using a NAND structure will include several NAND strings. Each NAND string is connected to the source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to one or more sense amplifiers.

Figure 2A:
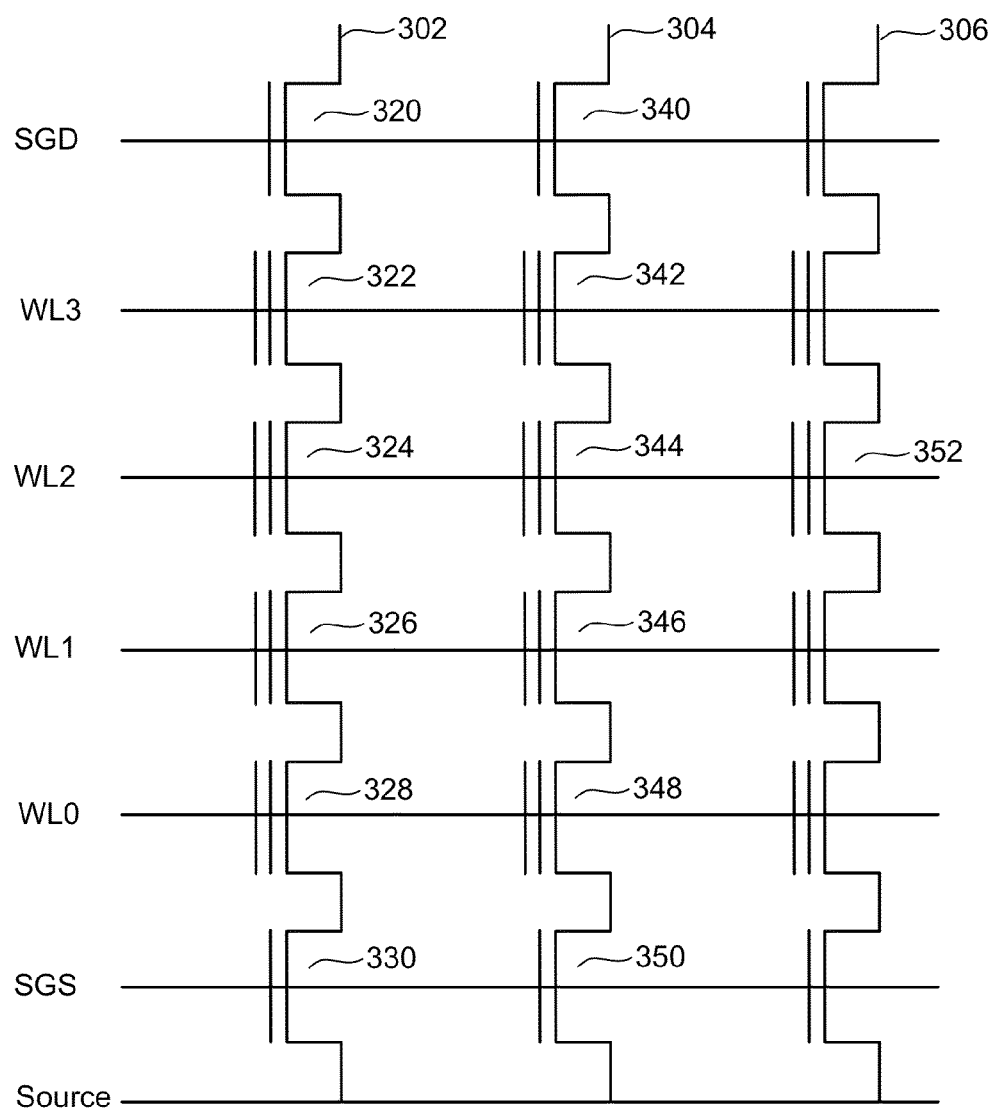
FIG. 2A is a circuit diagram of three NAND strings with associated word lines.

FIG. 2A shows three NAND strings 302, 304 and 306 of a memory array having many more NAND strings. Each of the NAND strings of FIG. 2A includes two select transistors and four memory cells. For example, NAND string 302 includes select transistors 320 and 330, and memory cells 322, 324, 326 and 328. NAND string 304 includes select transistors 340 and 350, and memory cells 342, 344, 346 and 348. Each NAND string is connected to the source line by its select transistor (e.g. select transistor 330 and select transistor 350). A selection line SGS is used to control the source side select gates. The various NAND strings are connected to respective bit lines by select transistors 320, 340, etc., which are controlled by select line SGD. In other embodiments, the select lines do not necessarily need to be in common. Word line WL3 is connected to the control gates for memory cell 322 and memory cell 342. Word line WL2 is connected to the control gates for memory cell 324, memory cell 344, and memory cell 352. Word line WL1 is connected to the control gates for memory cell 326 and memory cell 346. Word line WL0 is connected to the control gates for memory cell 328 and memory cell 348. As can be seen, each bit line and the respective NAND string comprise the columns of the array of memory cells. The word lines (WL3, WL2, WL1 and WL0) comprise the rows of the array.

Figure 2B:
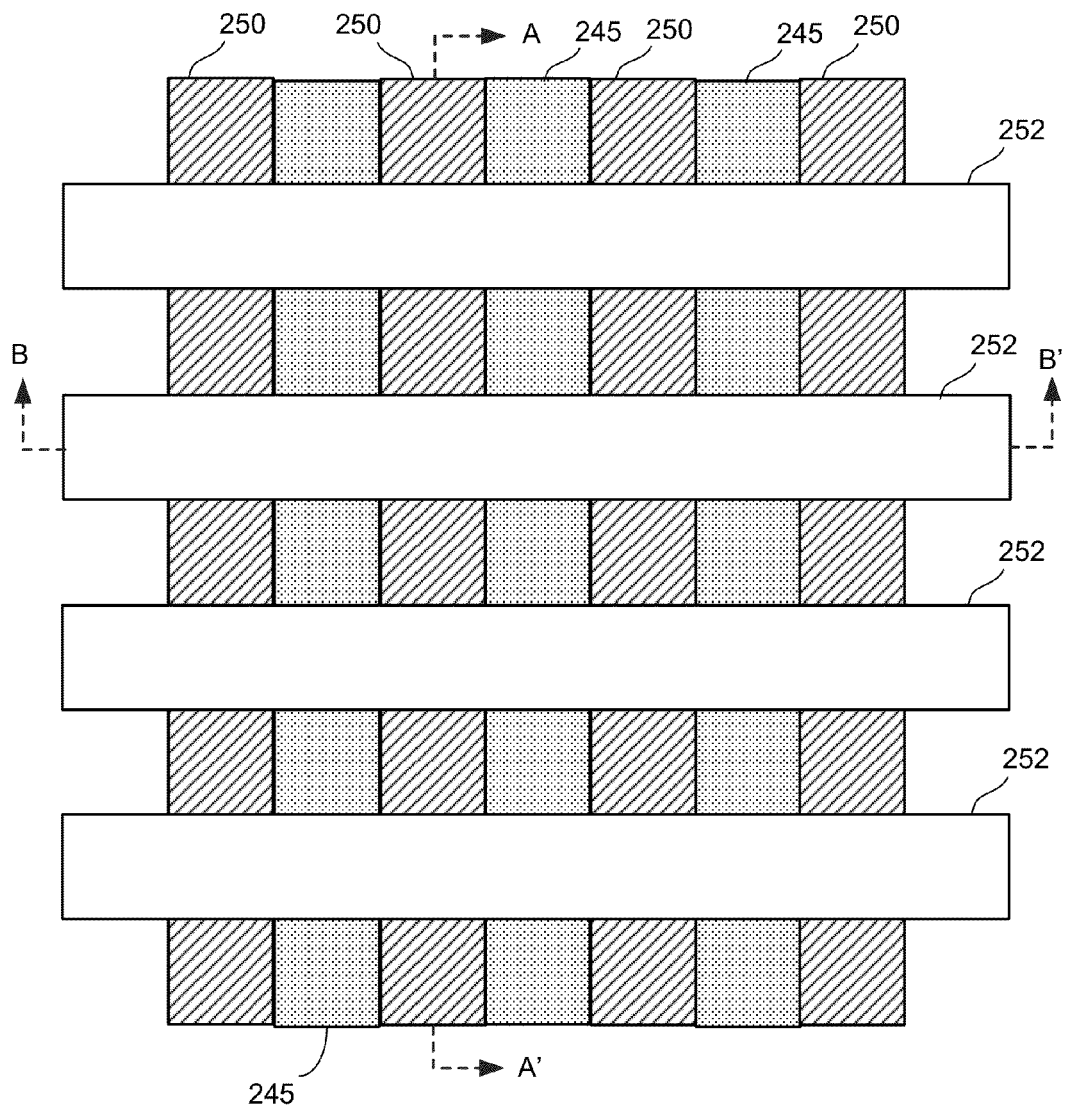
FIG. 2B is a top view of the three NAND strings and word lines.

FIG. 2B is a top view of a portion of an array of NAND flash memory cells. The array includes bit lines 250 and word lines 252. Shallow trench isolation (STI) structures 245 are depicted between the bit lines 250 (note the bit lines are not at the same level as the STI structures 245). Note that FIG. 2B does not show all of the other details of the flash memory cells. Note that a NAND string can have fewer or more memory cells than depicted in FIGS. 2A and 2B. For example, some NAND strings will include eight memory cells, 16 memory cells, 32 memory cells, 64 memory cells, 128 memory cells, etc. The discussion herein is not limited to any particular number of memory cells in a NAND string. Furthermore, a wordline can have more or fewer memory cells than depicted in FIGS. 2A and 2B. For example, a wordline can include thousand or tens of thousands of memory cells. The discussion herein is not limited to any particular number of memory cells in a wordline.

Each memory cell can store data (analog or digital). When storing one bit of digital data, the range of possible threshold voltages of the memory cell is divided into two ranges which are assigned logical data "1" and "0." In one example of a NAND type flash memory, the threshold voltage is negative after the memory cell is erased, and defined as logic "1." The threshold voltage after programming is positive and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored.

In the case of storing multiple levels of data, the range of possible threshold voltages is divided into the number of levels of data. For example, if four levels of information is stored (two bits of data), there will be four threshold voltage ranges assigned to the data values "11", "10", "01", and "00." In one example of a NAND type memory, the threshold voltage after an erase operation is negative and defined as "11". Positive threshold voltages are used for the data states of "10", "01", and "00." If eight levels of information (or states) are stored (e.g. for three bits of data), there will be eight threshold voltage ranges assigned to the data values "000", "001", "010", "011" "100", "101", "110" and "111."

The specific relationship between the data programmed into the memory cell and the threshold voltage levels of the cell depends upon the data encoding scheme adopted for the cells. For example, U.S. Pat. No. 6,222,762 and U.S. Patent Application Publication No. 2004/0255090, both of which are incorporated herein by reference in their entirety, describe various data encoding schemes for multi-state flash memory cells. In one embodiment, data values are assigned to the threshold voltage ranges using a Gray code assignment so that if the threshold voltage of a floating gate erroneously shifts to its neighboring physical state, only one bit will be affected. In some embodiments, the data encoding scheme can be changed for different word lines, the data encoding scheme can be changed over time, or the data bits for random word lines may be inverted or otherwise randomized to reduce data pattern sensitivity and even wear on the memory cells.

Relevant examples of NAND type flash memories and their operation are provided in the following U.S. patents/Patent Applications, all of which are incorporated herein by reference: U.S. Pat. Nos. 5,570,315; 5,774,397; 6,046,935; 6,456,528; and U.S. Pat. Publication No. US2003/0002348. The discussion herein can also apply to other types of flash memory in addition to NAND as well as other types of non-volatile memory. For example, the following patents describe NOR type flash memories and are incorporated herein by reference in their entirety: U.S. Pat. Nos. 5,095,344; 5,172,338; 5,890,192 and 6,151,248.

Other types of non-volatile storage devices, in addition to NAND flash memory, can also be used. For example, a so called TANOS structure (consisting of a stacked layer of TaN—$Al_2O_3$—SiN—$SiO_2$ on a silicon substrate), which is basically a memory cell using trapping of charge in a nitride layer (instead of a floating gate), can also be used with the present invention. Another type of memory cell useful in flash EEPROM systems utilizes a non-conductive dielectric material in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The memory cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar memory cell in a split-gate configuration where a doped polysilicon gate extends over a portion of the memory cell channel to form a separate select transistor. The foregoing two articles are incorporated herein by reference in their entirety. The programming techniques mentioned in section 1.2 of "Nonvolatile Semiconductor Memory Technology," edited by William D. Brown and Joe E. Brewer, IEEE Press, 1998, incorporated herein by reference, are also described in that section to be applicable to dielectric charge-trapping devices. Other types of memory devices can also be used.

Figure 3:
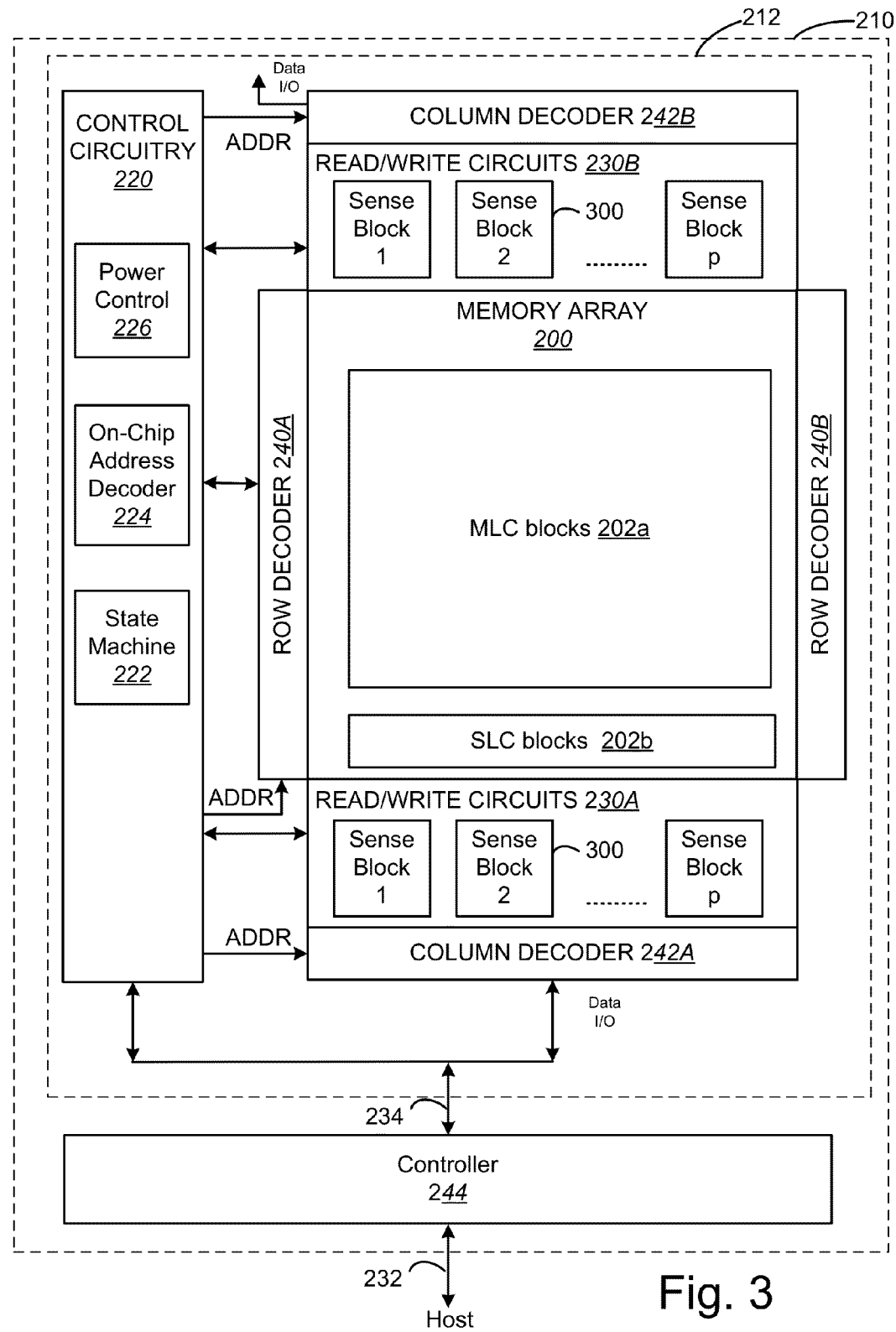
FIG. 3 is a block diagram of an array of NAND flash storage elements.

FIG. 3 illustrates a non-volatile storage device 210 that may include one or more memory die or chips 212. Memory die 212 includes an array (two-dimensional or three dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 100 is addressable by word lines via row decoders 240A and 240B and by bit lines via column decoders 242A and 242B. In a typical embodiment, a controller 244 is included in the same memory device 210 (e.g., a removable storage card or package) as the one or more memory die 212. Commands and data are transferred between the host and controller 244 via lines 232 and between the controller and the one or more memory die 212 via lines 234. One implementation can include multiple chips 212.

Control circuitry 220 cooperates with the read/write circuits 230A and 230B to perform memory operations on the memory array 200. The control circuitry 220 includes a state machine 222, an on-chip address decoder 224 and a power control module 226. The state machine 222 provides chip-level control of memory operations. The on-chip address decoder 224 provides an address interface to convert between the address that is used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage.

The memory array 200 includes MLC blocks 202a and SLC blocks 202b. In one embodiment, an SLC block and an MLC block have the same number of memory cells for user or system data; however, because an MLC stores multiple bits per cell an MLC block may store 2, 4, or 8 times as much data as an SLC block. However, it is not required that SLC blocks and MLC blocks have the same number of memory cells. In one embodiment, an SLC block has twice as many memory cells for user or system data than an MLC block. In one embodiment, an SLC block has three times (or about three times) as many memory cells for user or system data than an MLC block. In one embodiment, an SLC block has four times (or about four times) as many memory cells for user or system data than an MLC block.

Typically, the data stored in the MLC blocks is processed with a very strong ECC algorithm in order to provide greater reliability. Such strong ECC is generally not required with SLC blocks. A region of the memory array 200 having SLC blocks will be referred to herein as "an SLC region" and a region of the memory array 200 having MLC blocks will be referred to as "an MLC region." In one embodiment, there may be one or more SLC regions in a given memory array 200. In one embodiment, there may be one or more MLC regions in a given memory array 200. Thus, there could be more than one SLC region or more than one MLC region in a memory array 200.

In some embodiments, when the controller 244 receives user data it is first stored in one or more SLC blocks 202b. The controller 244 could also store system data in an SLC block 202b. At some point, the user and/or system data stored in the SLC blocks may be transferred into one or more MLC blocks 202a. Note that this technique may result in data being stored in MLC blocks for longer periods of time than in SLC blocks, but that is not required. It also may result in SLC blocks undergoing more erase/program cycles. Therefore, endurance may be of greater concern for SLC blocks. On the other hand, data retention may be of greater concern for MLC blocks.

In one embodiment, one or any combination of control circuitry 220, power control circuit 226, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits.

Figure 4:
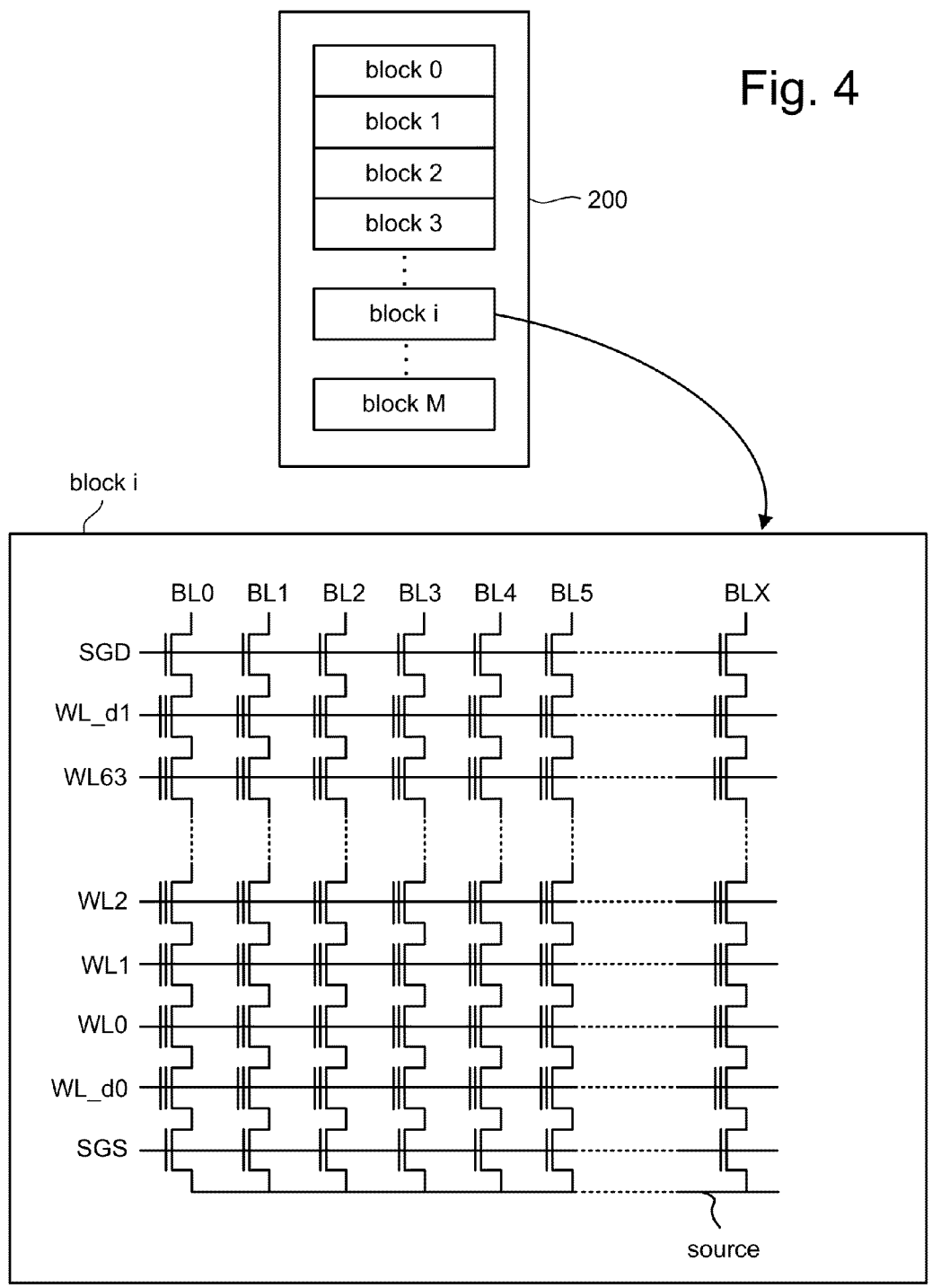
FIG. 4 is a block diagram depicting one embodiment of a memory array.

FIG. 4 depicts an exemplary structure of memory cell array 200. In one embodiment, the array of memory cells is divided into M blocks of memory cells. A block is either an SLC block 202b or an MLC block 202a, in one embodiment. As is common for flash EEPROM systems, the block is the unit of erase. That is, each block contains the minimum number of memory cells that are erased together. Each block is typically divided into a number of pages. A page is a unit of programming. One or more pages of data are typically stored in one row of memory cells. A page can store one or more sectors. A sector includes user data and overhead data. Overhead data typically includes an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks and arrangements can also be used.

In another embodiment, the bit lines are divided into odd bit lines and even bit lines. In an odd/even bit line architecture, memory cells along a common word line and connected to the odd bit lines are programmed at one time, while memory cells along a common word line and connected to even bit lines are programmed at another time.

FIG. 4 shows more details of block i of memory array 200. Block i includes X+1 bit lines and X+1 NAND strings. Block i also includes 64 data word lines (WL0-WL63), two dummy word lines (WL_d0 and WL_d1), a drain side select line (SGD) and a source side select line (SGS). One terminal of each NAND string is connected to a corresponding bit line via a drain select gate (connected to select line SGD), and another terminal is connected to the source line via a source select gate (connected to select line SGS). Because there are sixty four data word lines and two dummy word lines, each NAND string includes sixty four data memory cells and two dummy memory cells. In other embodiments, the NAND strings can have more or fewer than 64 data memory cells and two dummy memory cells. Data memory cells can store user or system data. Dummy memory cells are typically not used to store user or system data. Some embodiments do not include dummy memory cells.

The M blocks may include some blocks that are dedicated to storing a single bit per memory cell (e.g., SLC blocks). Others of the M blocks may be used to store multiple bits per memory cell (e.g., MLC block). Note that an MLC block could store a single bit per memory cell. In one embodiment, there are a different number of data word lines in an SLC block than in MLC blocks. A data word line is one which is used to store user or system data. This is in contrast to a dummy word line that is typically not used to store user or system data. In one embodiment, an SLC block has twice as many data word lines as an MLC block. For example, the MLC block could have 64 data word lines, whereas the SLC block could have 128 data word lines. In one embodiment, an SLC block has three times as many data word lines as an MLC block. For example, the MLC block could have 64 data word lines, whereas the SLC block could have 192 data word lines. In one embodiment, an SLC block has four times as many data word lines as an MLC block. For example, the MLC block could have 64 data word lines, whereas the SLC block could have 264 data word lines.

Figure 5:
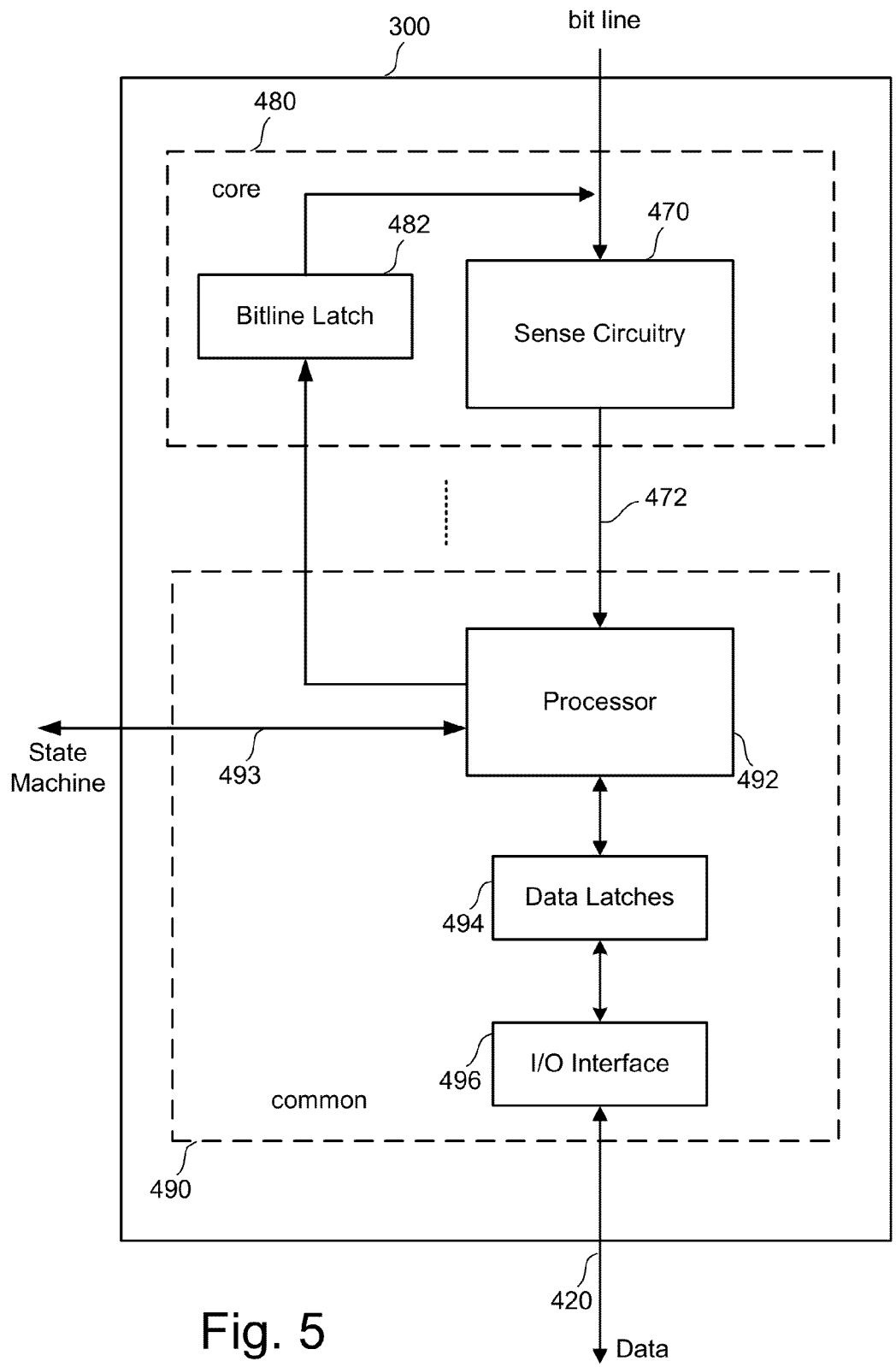
FIG. 5 is a block diagram depicting one embodiment of a sense block.

FIG. 5 is a block diagram of an individual sense block 300 partitioned into a core portion, referred to as a sense module 480, and a common portion 490. In one embodiment, there will be a separate sense module 480 for each bit line and one common portion 490 for a set of multiple sense modules 480. In one example, a sense block will include one common portion 490 and eight sense modules 480. Each of the sense modules in a group will communicate with the associated common portion via a data bus 472. For further details, refer to U.S. Patent Application Publication 2006/0140007, which is incorporated herein by reference in its entirety.

Sense module 480 comprises sense circuitry 470 that determines whether a conduction current in a connected bit line is above or below a predetermined threshold level. In some embodiments, sense module 480 includes a circuit commonly referred to as a sense amplifier. Sense module 480 also includes a bit line latch 482 that is used to set a voltage condition on the connected bit line. For example, a predetermined state latched in bit line latch 482 will result in the connected bit line being pulled to a state designating program inhibit (e.g., Vdd).

Common portion 490 comprises a processor 492, a set of data latches 494 and an I/O Interface 496 coupled between the set of data latches 494 and data bus 420. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 420 during a program operation. The imported data bits represent write data meant to be programmed into the memory. I/O interface 496 provides an interface between data latches 494 and the data bus 420.

During read or sensing, the operation of the system is under the control of state machine 222 that controls the supply of different control gate voltages to the addressed cell. As it steps through the various predefined control gate voltages corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

It is anticipated that some implementations will include multiple processors 492. In one embodiment, each processor 492 will include an output line (not depicted in FIG. 5) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 492 to accumulate the results of the associated bit lines such that the state machine need only read the wired-OR line one time.

During program or verify, the data to be programmed is stored in the set of data latches 494 from the data bus 420. The program operation, under the control of the state machine, comprises a series of programming voltage pulses (with increasing magnitudes) applied to the control gates of the addressed memory cells. Each programming pulse is followed by a verify process to determine if the memory cell has been programmed to the desired state. Processor 492 monitors the verified memory state relative to the desired memory state. When the two are in agreement, processor 492 sets the bit line latch 482 so as to cause the bit line to be pulled to a state designating program inhibit. This inhibits the cell coupled to the bit line from further programming even if it is subjected to programming pulses on its control gate. In other embodiments the processor initially loads the bit line latch 482 and the sense circuitry sets it to an inhibit value during the verify process.

Data latch stack 494 contains a stack of data latches corresponding to the sense module. In one embodiment, there are 3-5 (or another number) data latches per sense module 480. In one embodiment, the latches are each one bit. In some implementations (but not required), the data latches are implemented as a shift register so that the parallel data stored therein is converted to serial data for data bus 420, and vice versa. In one preferred embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the read operations and sense amplifiers can be found in (1) U.S. Pat. No. 7,196,931, "Non-Volatile Memory and Method with Reduced Source Line Bias Errors"; (2) U.S. Pat. No. 7,023,736, "Non-Volatile Memory and Method with Improved Sensing,"; (3) U.S. Patent Application Pub. No. 2005/0169082; (4) U.S. Pat. No. 7,196,928, "Compensating for Coupling during Read Operations of Non-Volatile Memory," and (5) United States Patent Application Pub. No. 2006/0158947, "Reference Sense Amplifier for Non-Volatile Memory," published on Jul. 20, 2006. All five of the immediately above-listed patent documents are incorporated herein by reference in their entirety.

At the end of a successful programming process (with verification), the threshold voltages of the memory cells should be within one or more distributions of threshold voltages for programmed memory cells or within a distribution of threshold voltages for erased memory cells, as appropriate. FIG. 6A depicts example Vt distributions for states of memory cells in an SLC block. Sometimes, such a distribution may be used in an MLC block. For example, sometimes a single page is initially programmed into a word line in an MLC block, which may result in a distribution such as in FIG. 6A.

FIG. 6B illustrates example Vt distributions corresponding to data states for the memory cell array when each memory cell stores four bits of data. Such a distribution may be used for programming an MLC block. Other embodiments, however, may use more or fewer than four bits of data per memory cell. FIG. 6B shows 16 Vt distributions corresponding to data states 0-15. In some embodiments, the threshold voltages in state 0 are negative and the threshold voltages in the states 1-15 are positive. However, the threshold voltages in one or more of states 1-15 may be negative.

Between each of the data states 0-15 are read reference voltages used for reading data from memory cells. For example, FIG. 6B shows read reference voltage Vr1 between data states 0 and 1, and Vr2 between data states 1 and 2. By testing whether the threshold voltage of a given memory cell is above or below the respective read reference voltages, the system can determine what state the memory cell is in.

At or near the lower edge of each data state 0-15 are verify reference voltages. For example, FIG. 6B shows Vv1 for state 1 and Vv2 for state 2. When programming memory cells to a given state, the system will test whether those memory cells have a threshold voltage greater than or equal to the verify reference voltage.

FIG. 6C illustrates that another embodiment of Vt distributions corresponding to data states 0-15 can partially overlap since the correction algorithm can handle a certain percentage of cells that are in error. Also note that the Vt axis may be offset from actual voltages applied to the control gates as body effect through source or body biasing is used to shift negative threshold voltage into the measurable positive range. Another point to note is that contrary to the equal spacing/width of the depicted sixteen states, various states may have different widths/spacings in order to accommodate varying amounts of susceptibility to data retention loss. In some embodiments, states 0 and/or 15 are wider than the other states.

Referring again to FIG. 6A, State 0 may be an erase distribution that results from erasing all memory cells in an SLC block. The erase verification voltage is not explicitly depicted but may be just at the right edge of the erase distribution. When an SLC block is programmed, the system moves the threshold voltage of selected memory cells to distribution 1. The system verifies whether memory cells are programmed to a threshold voltage of Vv for state 1. After programming has been completed, the system reads memory cells by comparing their threshold voltage with Vr. Note that because the Vt distributions are widely separated in the SLC block that reliability may not be as challenging as for an MLC block.

Figure 7A:
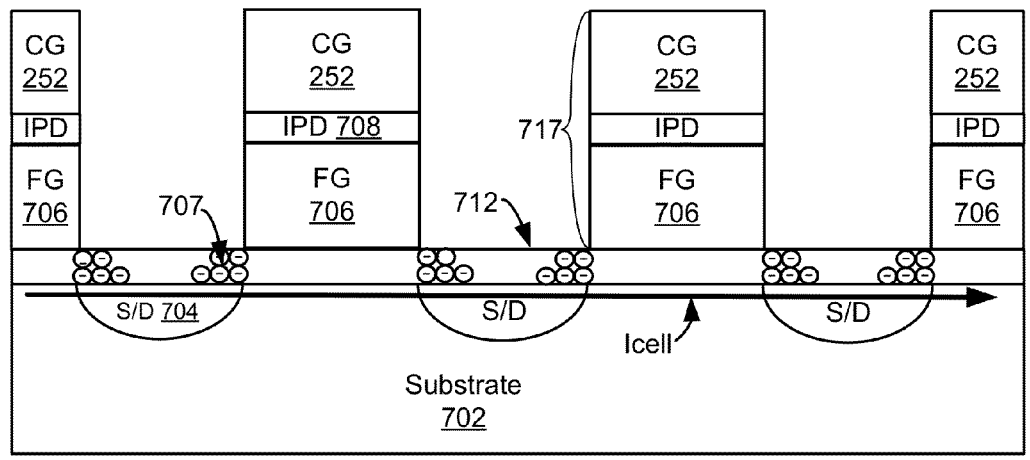
FIG. 7A depicts a portion of a NAND string over a substrate to illustrate a problem of charge becoming trapped.

The following describe possible reasons why a block of memory cells may have endurance problems. FIG. 7A depicts a portion of a NAND string over a substrate 702. FIG. 7A is a perspective view along a portion of the line A-A in FIG. 2B. The NAND string includes a number of floating gates stacks 717, each of which includes a floating gate 706 (FG), inter poly dielectric 708 (IPD), and control gate 252 (CG). A tunnel oxide layer 712 resides between the substrate 702 and the FG 706. Source/drain regions 704 (S/D), which may be formed of implanted impurity ions are depicted in the substrate 702.

Figure 7B:
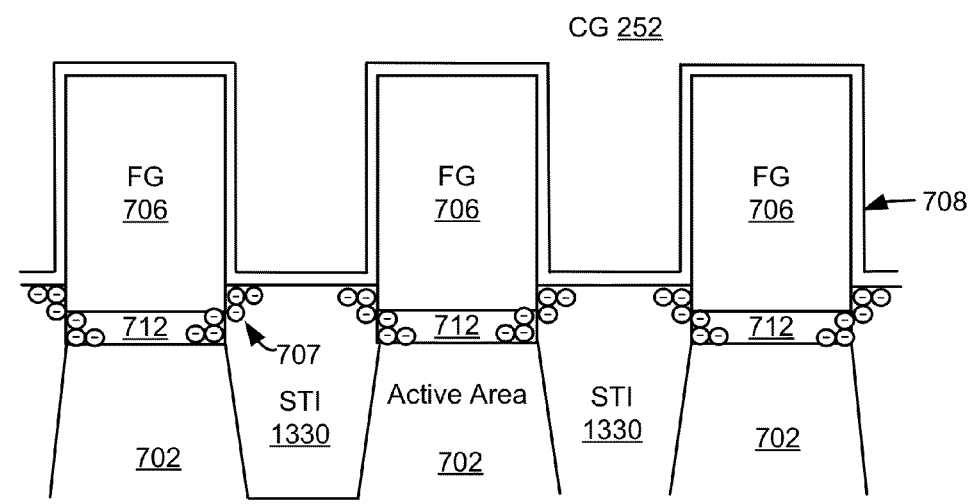
FIG. 7B depicts a slice of three NAND strings over a substrate to illustrate a problem of charge becoming trapped.

FIG. 7B depicts a slice of three NAND strings over a substrate 702. FIG. 7B is a perspective view along a portion of the line B-B in FIG. 2B. The slice shows one FG 706 of each NAND string. Shallow trench isolation structures (STI) 1330 provide electrical isolation between NAND strings, especially for the active area below the tunnel oxide 712. The CG 252 extends down between FGs 706 on adjacent NAND strings, which may improve the coupling between the FG 706 and CG 252. Application of a voltage to a control gate 252 may cause formation of a conductive channel in the portion of the substrate 702 just beneath the floating gate 706. Thus, a current (e.g., "Icell" in FIG. 7A) may flow from one channel to the next via the source/drain regions 704. For example, this current might occur during a read operation.

Over time, as a result of programming and erasing the memory cells, charge 707 may become trapped in the tunnel oxide layer 712 above the substrate 702 and in the STI region at the CG/Active Area corner. The electric field from the CG 252 to the Active Area (AA) corner will cause trapping in the oxide in the STI region between CG and AA corner). Each time that the memory cell is programmed, the programming voltage that is applied to the control gate 252 (or word line) may cause electrons from the channel to be injected into the floating gate 706. When electrons accumulate in the floating gate 706, the floating gate 706 becomes negatively charged and the threshold voltage of the memory element is raised so that the memory element is considered to be in a programmed state. More information about such programming can be found in U.S. Pat. No. 6,859,397, titled "Source Side Self Boosting Technique For Non-Volatile Memory," and in U.S. Patent Application Publication 2005/0024939, titled "Detecting Over Programmed Memory," published Feb. 3, 2005; both of which are incorporated herein by reference in their entirety. However, undesirably some electrons (e.g., charge 707) may also be injected into the tunnel oxide layer 712 and into the oxide at the AA/CG corner as a result of the program voltage, and become trapped there. Specifically, trapped charge 707 is depicted in the tunnel oxide layer 712.

When the memory cells are erased, the electrons may be removed from the floating gates 706. However, erasing the memory cells may not be completely effective at removing the charge 707 in the tunnel oxide layer 712. The charges trapped at the CG/AA corner may be especially hard to erase. With additional erase/program cycles, this trapped charge 707 may accumulate. The following is a brief description of erasing a memory cell to help illustrate why the charge may become trapped. The storage elements are erased in one embodiment by raising a p-well to an erase voltage (e.g., 20 V) for a sufficient period of time and grounding the word lines (CG) 252 of a selected block while the source and bit lines are floating. Due to capacitive coupling, unselected word lines, bit lines, and select lines are raised to a significant fraction of the erase voltage. A strong electric field is thus applied to the tunnel oxide layers 712 of selected storage elements and the data of the selected storage elements are erased as electrons of the floating gates 706 are emitted to the substrate 702 side, typically by Fowler-Nordheim tunneling mechanism. As electrons are transferred from the floating gate 706 to the p-well region, the threshold voltage of a selected storage element is lowered. Erasing can be performed on the entire memory array, separate blocks, or another unit of storage elements. However, as already noted the erase process may not be completely effective at removing the trapped charge 707.

Moreover, the trapped charge 707 can be detrimental to memory cell performance during read operations. As previously discussed, when reading a given memory cell on the NAND string, a read voltage is applied to the memory cell being read and a read pass voltage (a voltage that will turn on the memory cell regardless of its programmed state) is applied to all other memory cells. If the memory cell that is being read turns on in response to the read voltage, a conduction current referred to in FIG. 7A as "Icell" will conduct along the NAND string. In other words, Icell is a function of how strongly the memory cell being read conducts a current in response to the read voltage. As already discussed, by comparing the magnitude of Icell with a reference current, it can be determined whether the memory cell being read turned on or not. Based on Vread, the threshold voltage of the memory cell, and hence its programmed state, can be determined.

However, the trapped charge 707 may increase the resistance along the NAND string, which may decrease Icell (the conduction current). Since the trapped charge 707 may increase with the number of erase/program cycles, the NAND string resistance tends to increase with increased erase/program cycles. As a result, a memory cell with the same actual threshold voltage may appear to have a smaller Icell over time. Consequently, the memory cell may appear to have a greater threshold voltage. That is, it may take a greater read voltage to cause Icell to equal a reference current (or demarcation current). Thus, the ability to accurately measure the programmed state of a memory cell can degrade with increasing cycle count.

Techniques are disclosed herein to reduce the amount of trapped charge 707 that might otherwise develop in an SLC block. The techniques may reduce the amount of trapped charge 707 that might otherwise develop in the tunnel oxide 712 of storage elements in an SLC block. In one embodiment, the tunnel oxide 712 is thinner in an SLC block 202b than in an MLC block 202a. This may allow a smaller program voltage to be used in the SLC block than if it had the same thickness tunnel oxide 712 as an MLC block has. The lower program voltage may reduce the amount of charge 707 that gets trapped.

One possible reason for this is that a smaller program voltage may reduce the electric field (E) between the lower portion of the CG 252 and the active area below the FG 706. The electric field could possible cause electrons to move from the active area towards the CG 252. However, it is possible for such electrons to get trapped in the tunnel oxide 712 and in the oxide in the CG/AA corner. However, by reducing the program voltage, this electric field may be reduced. Reduction in the electric field may reduce the amount trapped charge 707. Note that a thicker tunnel oxide in the MLC blocks can help for data retention.

In one embodiment, the inter-gate dielectric 708 (sometimes referred to as an "inter-poly dielectric" or IPD) is made thinner in the SLC blocks 202b than in the MLC blocks 202a. A thinner IPD may improve the coupling ratio between the CG 252 and FG 706. An improved coupling ratio may reduce the program voltage needed in SLC blocks, which may reduce the trapped charge 707 that could otherwise develop with additional erase/program cycles. However, a thicker IPD in the MLC blocks can help for data retention, program saturation and read disturb.

Figure 8A:
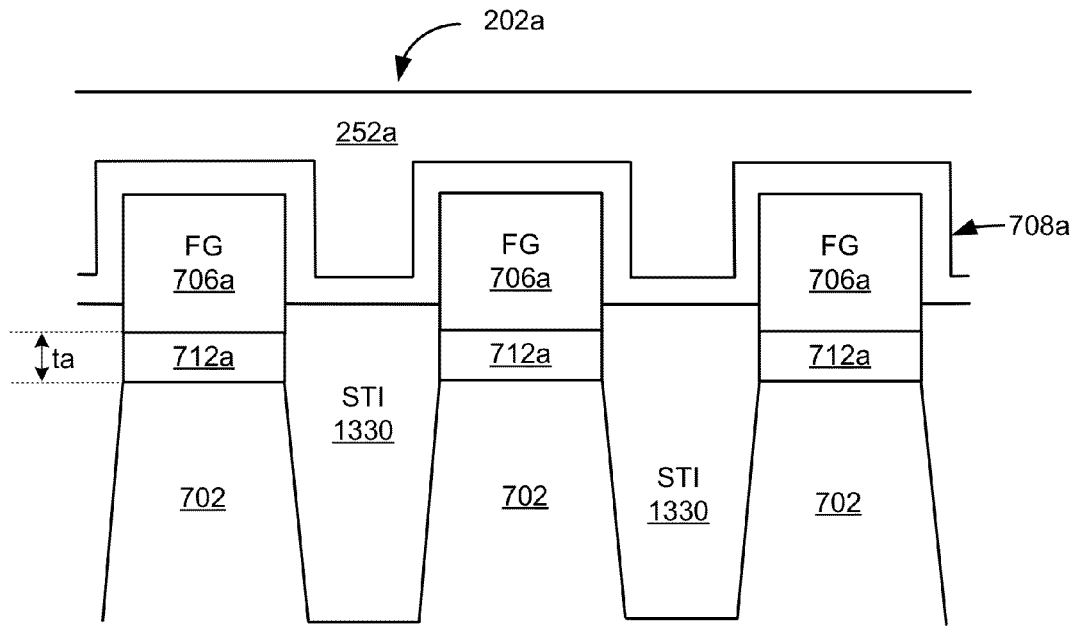
FIG. 8A depicts a portion of one embodiment of an MLC block 202a in a memory array.
Figure 8B:
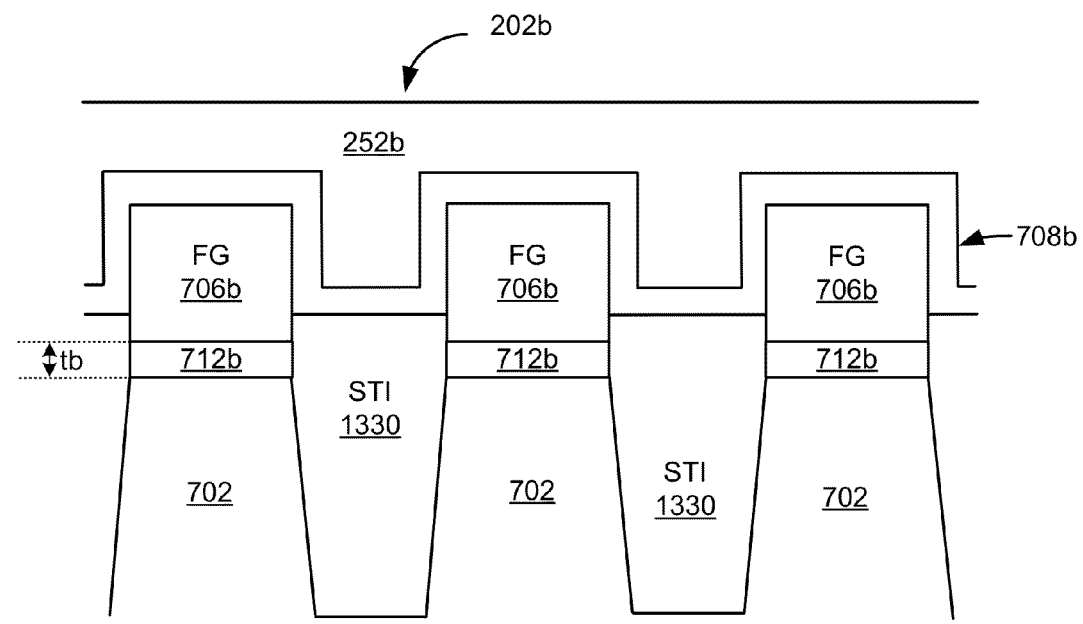
FIG. 8B depicts a portion of one embodiment of an SLC block 202b in a memory array.

FIG. 8A depicts a portion of one embodiment of an MLC block 202a in a memory array. FIG. 8B depicts a portion of one embodiment of an SLC block 202b in a memory array. Each show a perspective view along a portion of the line B-B in FIG. 2B. The tunnel oxide 712a in the MLC block 202a has a thickness of "$t_a$." The tunnel oxide 712b in the SLC block 202b has a thickness of "$t_b$." In one embodiment, $t_a$ is greater than $t_b$. That is, the tunnel oxide 712a in the MLC block 202a is thicker than the tunnel oxide 712b in the SLC block 202b.

There may be some variation in the thickness of the tunnel oxide 712 from one memory cell to the next, due to limitations of the process of forming the tunnel oxide 712. This applies to both SLC blocks 202b and MLC blocks 202a. Thus, there could be a few storage elements in an MLC block 202a having a tunnel oxide 712a that is thinner than $t_b$ due to process variation. Also, there could be a few storage elements in an SLC block 202b having a tunnel oxide 712b that is thicker than $t_a$ due to process variation.

In one embodiment, each storage element in an SLC block 202b has a tunnel oxide 712b having approximately a first thickness (e.g., $t_b$). In this embodiment, each storage element in an MLC block 202a has a tunnel oxide 712a having approximately a second thickness (e.g., $t_a$) that is greater than the first thickness. In this embodiment, substantially all of the non-volatile storage elements in the MLC block 202a have a thicker tunnel oxide 712a than the first thickness. However, note that some of the storage elements in the MLC block 202a might have a tunnel oxide 712a that is thinner than the first thickness due to variation in the thickness of the tunnel oxide 712 from one memory cell to the next.

In one embodiment, substantially all of the non-volatile storage elements in the SLC block 202b have a thinner tunnel oxide 712b than the second thickness. However, note that some of the storage elements in the SLC block 202b might have a tunnel oxide 712b that is thicker than the second thickness due to variation in the thickness of the tunnel oxide 712 from one memory cell to the next.

In one embodiment, the average thickness of the tunnel oxide 712a in the MLC block 202a is greater than the average thickness of the tunnel oxide 712b in the SLC block 202b.

Figure 9:
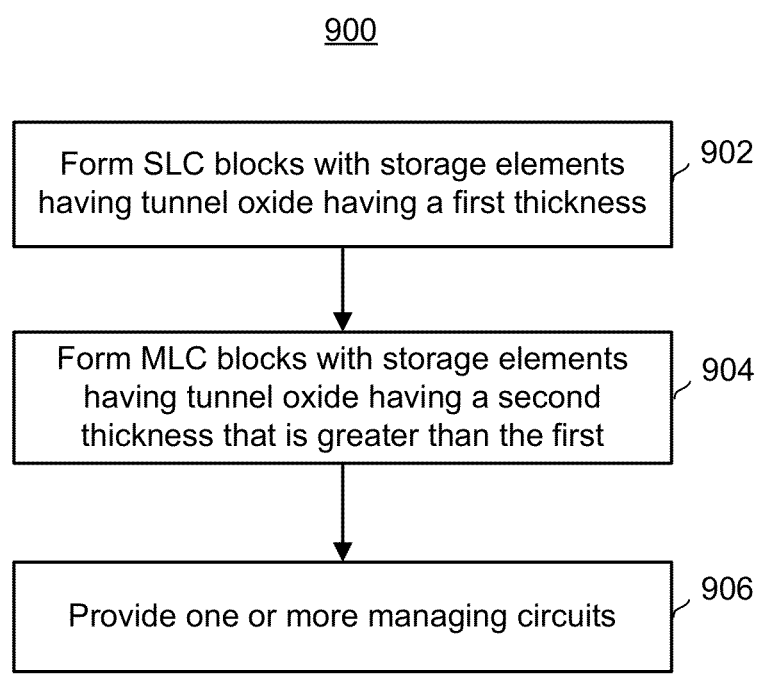
FIG. 9 is a flowchart of one embodiment of a process of forming a memory array with SLC blocks having one tunnel oxide thickness and MLC blocks having a different tunnel oxide thickness.

FIG. 9 is a flowchart of one embodiment of a process 900 of forming a memory array 200 with SLC blocks 202b having one tunnel oxide thickness 712b and MLC blocks 202a having a different tunnel oxide thickness 712a. FIG. 9 may be used to form the MLC block 202a and SLC block 202b depicted in FIGS. 8A and 8B, respectively. In step 902, SLC blocks are formed with storage elements having a first tunnel oxide having approximately a first thickness. The SLC blocks may be dedicated to storing a single bit per storage element.

Step 904 includes forming multi-level cell (MLC) blocks with non-volatile storage elements having a second tunnel oxide having approximately a second thickness that is greater than the first thickness.

Steps 902 and 904 may include performing a process step that deliberately causes the second tunnel oxide to be thicker than the first tunnel oxide. Steps 902 and 904 may include performing different process steps to form the first tunnel oxide than the process steps used to form the second tunnel oxide. In one embodiment, steps 902 and 904 include removing oxide from a region where SLC blocks are being formed without removing oxide from a region where the MLC blocks are being formed to achieve the thinner first tunnel oxide. In one embodiment, the first tunnel oxide is formed from a single layer of oxide, whereas the second tunnel oxide is formed from two layers of oxide. Steps 902 and 904 are intended to deliberately cause storage elements in the SLC blocks 202b to have a thinner tunnel oxide than the tunnel oxide in the MLC blocks 202a, in one embodiment.

Steps 902 and 904 may include forming the first tunnel oxide and forming the second tunnel oxide using one more process steps to deliberately cause a first non-volatile storage element in an SLC block to have a thinner tunnel oxide than the tunnel oxide of a second non-volatile storage element in an MLC block.

Steps 902 and 904 may include forming the first tunnel oxide and forming the second tunnel oxide using one more process steps to cause substantially all of the non-volatile storage elements in the SLC blocks to have a thinner first tunnel oxide than the second thickness and substantially all of the non-volatile storage elements in the MLC blocks to have a thicker second tunnel oxide than the first thickness. In one embodiment, there may be a few non-volatile storage elements in the SLC blocks that have a thicker tunnel oxide than second thickness. In one embodiment, there may be a few non-volatile storage elements in the MLC blocks that have a thinner tunnel oxide than first thickness.

In step 906, one or more managing circuits are provided. The one or more managing circuits are in communication with the non-volatile storage elements in the SLC and MLC blocks. The one or more managing circuits are configured to store only a single bit in each of the non-volatile storage elements in the SLC blocks. The one or more managing circuits are configured to store multiple bits in each of the non-volatile storage elements in the MLC blocks. Note that that managing circuits could store a single bit in storage elements in the MLC blocks.

Figure 10A:
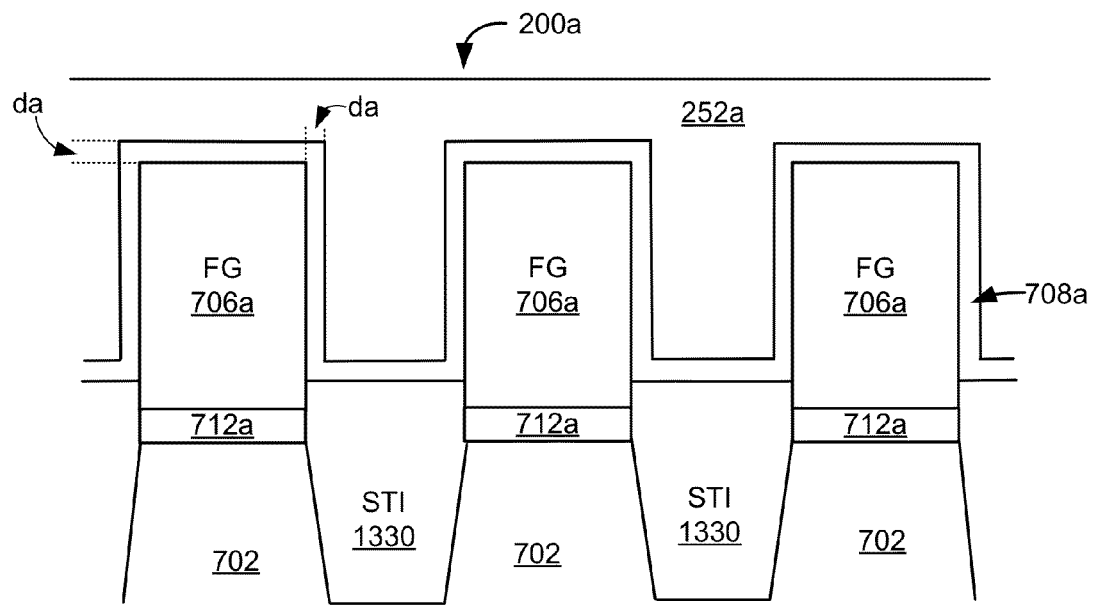
FIG. 10A depicts a portion of one embodiment of an MLC block in a memory array.
Figure 10B:
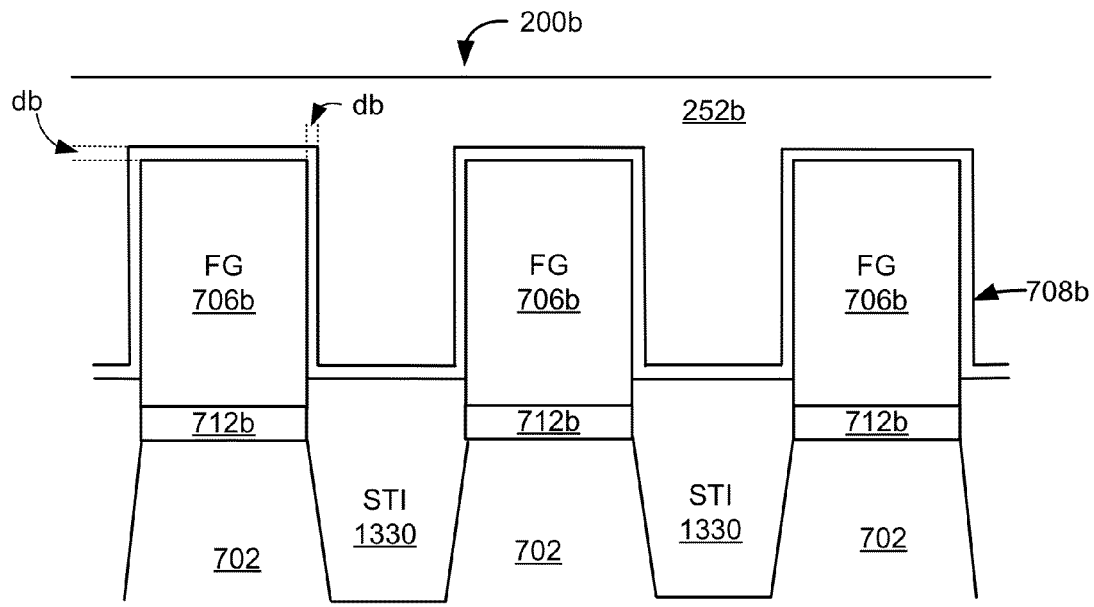
FIG. 10B depicts a portion of one embodiment of an SLC block in a memory array.

As noted above, one embodiment includes an SLC block having a thinner inter-gate dielectric (or IPD) than an IPD for storage elements in an MLC block. FIG. 10A depicts a portion of one embodiment of an MLC block 202a in a memory array. FIG. 10B depicts a portion of one embodiment of an SLC block 202b in a memory array. Each show a perspective view along a portion of the line B-B in FIG. 2B. The IPD 708a in the MLC block 202a has a thickness of "$d_a$." The IPD 708b in the SLC block 202b has a thickness of "$d_b$." In one embodiment, $d_a$ is greater than $d_b$. That is, the IPD 708a in the MLC block 202a is thicker than the IPD 708b in the SLC block 202b.

In one embodiment, the thickness of the IPD 708 is substantially uniform on the top and the sides of the FG 706. However, the IPD 708 is not required to be uniform on all sides of a FG 706. For example, the IPD 708 might be thinner or thicker on the sides of the FG than on the top.

The FGs 706 are not required to have the shape depicted in FIGS. 10A and 10B. In one embodiment, the sides of the FGs 706 slope such that the FG is wider at the bottom than at the top. In one embodiment, the FGs 706 have an inverted T-shape.

There may be some variation in the thickness of the IPD 708 from one memory cell to the next, due to limitations of the process of forming the IPD 708. This applies to both SLC blocks 202b and MLC blocks 202a. Thus, there could be a few storage elements in an MLC block 202a having an IPD 708 that is thinner than $d_b$ due to process variation. Also, there could be a few storage elements in an SLC block 202b having an IPD 708b that is thicker than $d_a$ due to process variation.

In one embodiment, all (or substantially all) storage elements in an SLC block 202b have an IPD 708b having approximately a first thickness (e.g., $d_b$). In this embodiment, all (or substantially all) storage elements in an MLC block 202a have an IPD 708a having approximately a second thickness (e.g., that is greater than the first thickness. In this embodiment, substantially all of the non-volatile storage elements in the MLC block 202a have a thicker IPD 708a than the first thickness. However, note that some of the storage elements in the MLC block 202a might have an IPD 708a that is thinner than the first thickness due to variation in the thickness of the IPD 708 from one memory cell to the next.

In one embodiment, substantially all of the non-volatile storage elements in the SLC block 202b have a thinner IPD 708b than the second thickness. However, note that some of the storage elements in the SLC block 202b might have an IPD 708b that is thicker than the second thickness due to variation in the thickness of the tunnel oxide 712 from one memory cell to the next.

In one embodiment, the average thickness of the IPD 708a in the MLC block 202a is greater than the average thickness of the IPD 708b in the SLC block 202b.

Figure 11:
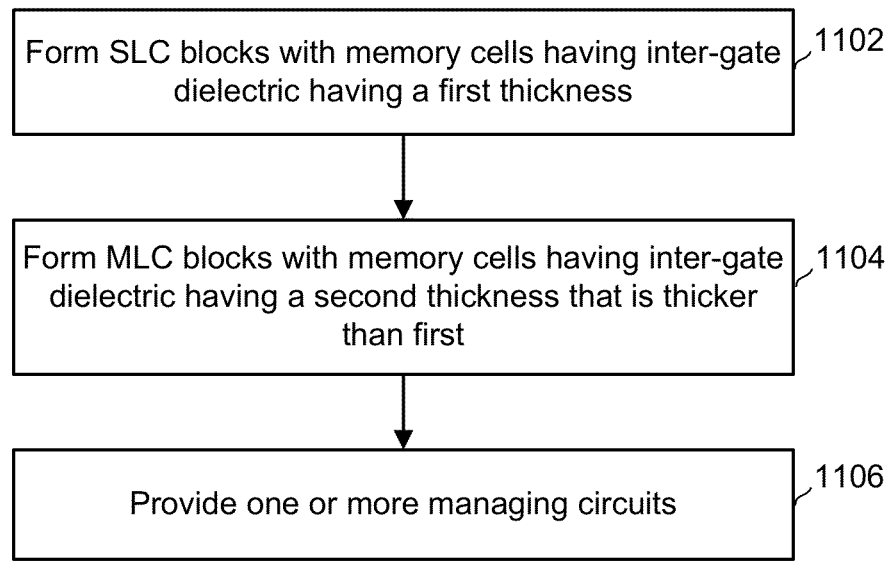
FIG. 11 is a flowchart of one embodiment of a process of forming a memory array having SLC blocks having one inter-gate dielectric thickness and MLC blocks having a different inter-gate dielectric thickness.

FIG. 11 is a flowchart of one embodiment of a process 1100 of forming a memory array having SLC blocks 202b having one inter-gate dielectric thickness 708b and MLC blocks 202a having a different inter-gate dielectric thickness 708a. FIG. 11 may be used to form the MLC block 202a and SLC block 202b depicted in FIGS. 10A and 10B, respectively. In step 1102, SLC blocks are formed with storage elements having a first inter-gate dielectric having approximately a first thickness. The SLC blocks may be dedicated to storing a single bit per storage element.

Step 1104 includes forming multi-level cell (MLC) blocks with non-volatile storage elements having a second inter-gate dielectric having approximately a second thickness that is greater than the first thickness.

Steps 1102 and 1104 may include forming the first inter-gate dielectric and forming the second inter-gate dielectric using one more process steps that cause substantially all of the non-volatile storage elements in the SLC region to have a thinner first inter-gate dielectric than the second thickness and substantially all of the non-volatile storage elements in the MLC blocks to have a thicker second inter-gate dielectric than the first thickness. In one embodiment, there may be a few non-volatile storage elements in the SLC blocks that have a thicker inter-gate dielectric than second thickness. In one embodiment, there may be a few non-volatile storage elements in the MLC blocks that have a thinner inter-gate dielectric than first thickness.

In one embodiment, steps 1102 and 1104 include removing a dielectric (e.g., SiN or $SiO_2$) from a region where SLC blocks are being formed to achieve the thinner first inter-gate dielectric. Steps 1102 and 1104 are intended to deliberately cause storage elements in the SLC blocks 202b to have a thinner inter-gate dielectric 708b than the inter-gate dielectric 708a in the MLC blocks 202a, in one embodiment.

Steps 1102 and 1104 may include forming the first inter-gate dielectric and forming the second inter-gate dielectric using one more process steps to deliberately cause a first non-volatile storage element in an SLC block to have a thinner inter-gate dielectric than the inter-gate dielectric of a second non-volatile storage element in an MLC block.

In step 1106, one or more managing circuits are provided. The one or more managing circuits are in communication with the non-volatile storage elements in the SLC and MLC blocks. The one or more managing circuits are configured to store only a single bit in each of the non-volatile storage elements in the SLC blocks. The one or more managing circuits are configured to store multiple bits in each of the non-volatile storage elements in the MLC blocks. Note that that managing circuits could store a single bit in storage elements in the MLC blocks.

Figure 12:
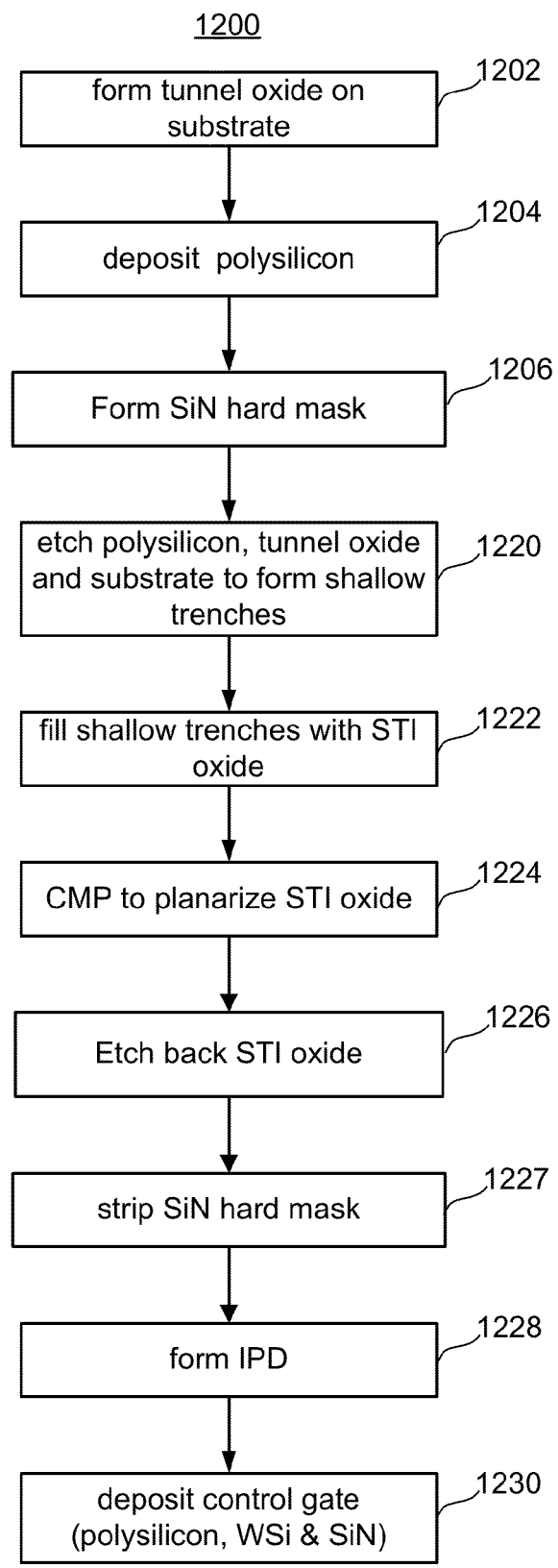
FIG. 12 is a flow chart describing one embodiment of a portion of a process for forming non-volatile storage elements.

FIG. 12 is a flow chart describing one embodiment of a portion of a process 1200 for forming non-volatile storage elements. Note that steps of process 1200 may be used to form both MLC blocks 202a and SLC blocks 202b. This flow chart does not describe all implant steps, the gap fill of etched volumes between the floating gate stacks, or forming the contacts, metallizations, vias, and passivation, as well as other portions of the manufacturing process known in the art. There are many ways to manufacture memory according to the present invention and, thus, the inventors contemplate that various methods other than that described by FIG. 12 can be used. While a flash memory chip will include core memory and peripheral circuitry, the process steps of FIG. 12 are intended only to describe in general terms one possible process recipe for the fabrication of the floating gate stacks in the MLC region and SLC region. For example, the floating gates can be formed to have many different shapes. In some embodiments, the floating gates have a relatively wide base with a relatively narrow stem above the base.

Figure 13:
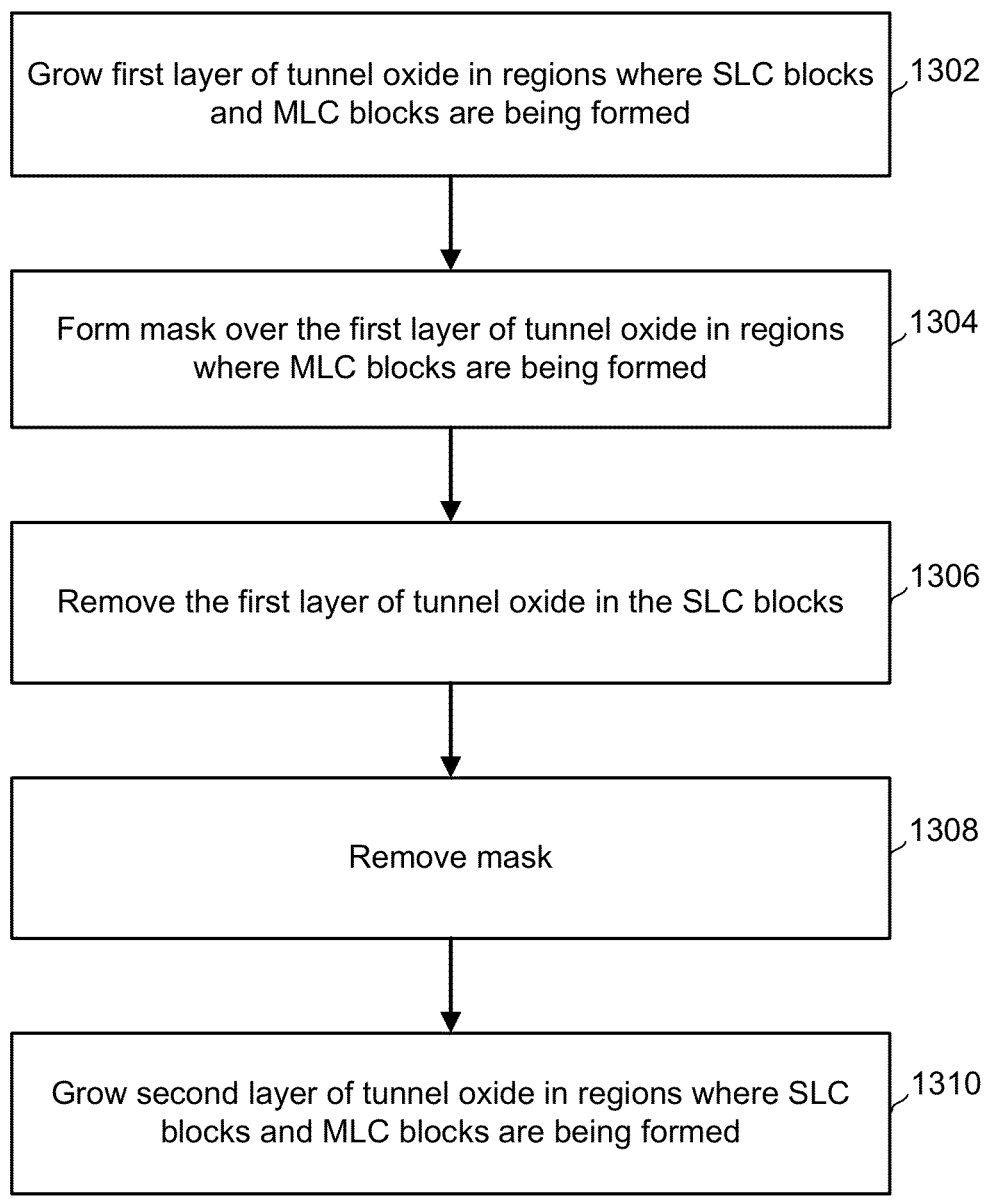
FIG. 13 is a flowchart of one embodiment of a process of forming a tunnel oxide in an SLC block having a different thickness than a tunnel oxide in an MLC block.

Step 1202 of FIG. 12 includes forming oxide material on top of a silicon substrate 702. This oxide will be used to form the tunnel oxide 712. FIG. 13 shows a flowchart of one embodiment of a process for forming the tunnel oxide in which the tunnel oxide is thinner in the SLC blocks 202b than in the MLC blocks 202a. Note that process 1200 does not require that the tunnel oxide in the SLC region have a different thickness than the tunnel oxide in the MLC region.

In step 1204, a polysilicon layer that will be used to form the floating gates 706 is deposited over the oxide material using CVD, PVD, ALD or another suitable method. In step 1206, a SiN hard mask is formed over the polysilicon layer to allow etching to form STI structures. Forming the SiN mask may be performed as follows. First, SiN is deposited over the entire polysilicon layer using, for example, CVD. Next, a photoresist layer is added over the SiN. The photoresist is exposed and developed to form a mask pattern. The pattern is transferred to the SiN, thus forming the SiN hard mask.

Next, shallow trench isolation trenches are formed based on the SiN hard mask. In step 1220, the polysilicon layer, the oxide material, and the top of the silicon substrate 702 are etched. In one embodiment, the etch is approximately 0.2 microns into the substrate 702 to create shallow trench isolation (STI) areas, where the bottom of the trenches are inside the top of the P-well. Forming the shallow trench isolation trenches also etches the polysilicon into strips that run in the direction of what will become NAND strings. Thus, the STI structures will separate adjacent NAND strings.

In step 1222, the STI trenches are filled with isolation material such as partially stabilized zirconia (PSZ), $SiO_2$ (or another suitable material) up to the top of the SiN hard mask using CVD, rapid ALD or another method. In step 1224, chemical mechanical polishing (CMP), or another suitable process, is used to polish the isolation material flat until reaching the SiN hard mask.

Figure 16A:
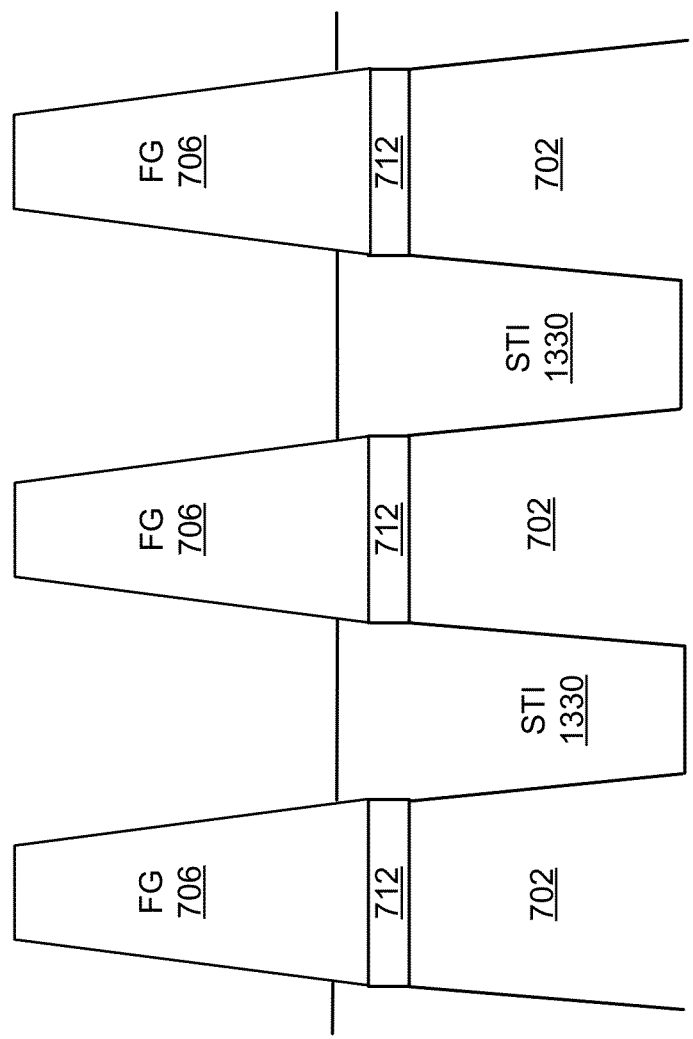
FIG. 16A depicts results after a step of one embodiment of the process of FIG. 12.

Step 1226 is etching back the STI isolation material. Step 1227 is removing the SiN hard mask. In step 1227, the SiN hard mask is stripped. FIG. 16A depicts results after one embodiment of step 1227. FIG. 16A depicts one embodiment of a FG 706 over a tunnel oxide 712. Note that a different shape may be used for the FG 706. In one embodiment, the FG 706 in the SLC region is shorter than the FG 706 in the MLC region.

In step 1228, the inter-poly dielectric 708 is grown or deposited. The IPD 708 may include alternating conformal layers of oxide and nitride. In one embodiment, the layers are silicon oxide (e.g., $SiO_2$) and silicon nitride (e.g., SiN). For example, an Oxide/Nitride/Oxide (ONO) inter-poly dielectric is used. In one embodiment, four alternating layers are formed (e.g., NONO from FG to CG). In one embodiment, five alternating layers are formed (e.g., ONONO). A different number of alternating conformal layers of oxide and nitride may be used.

Figure 15:
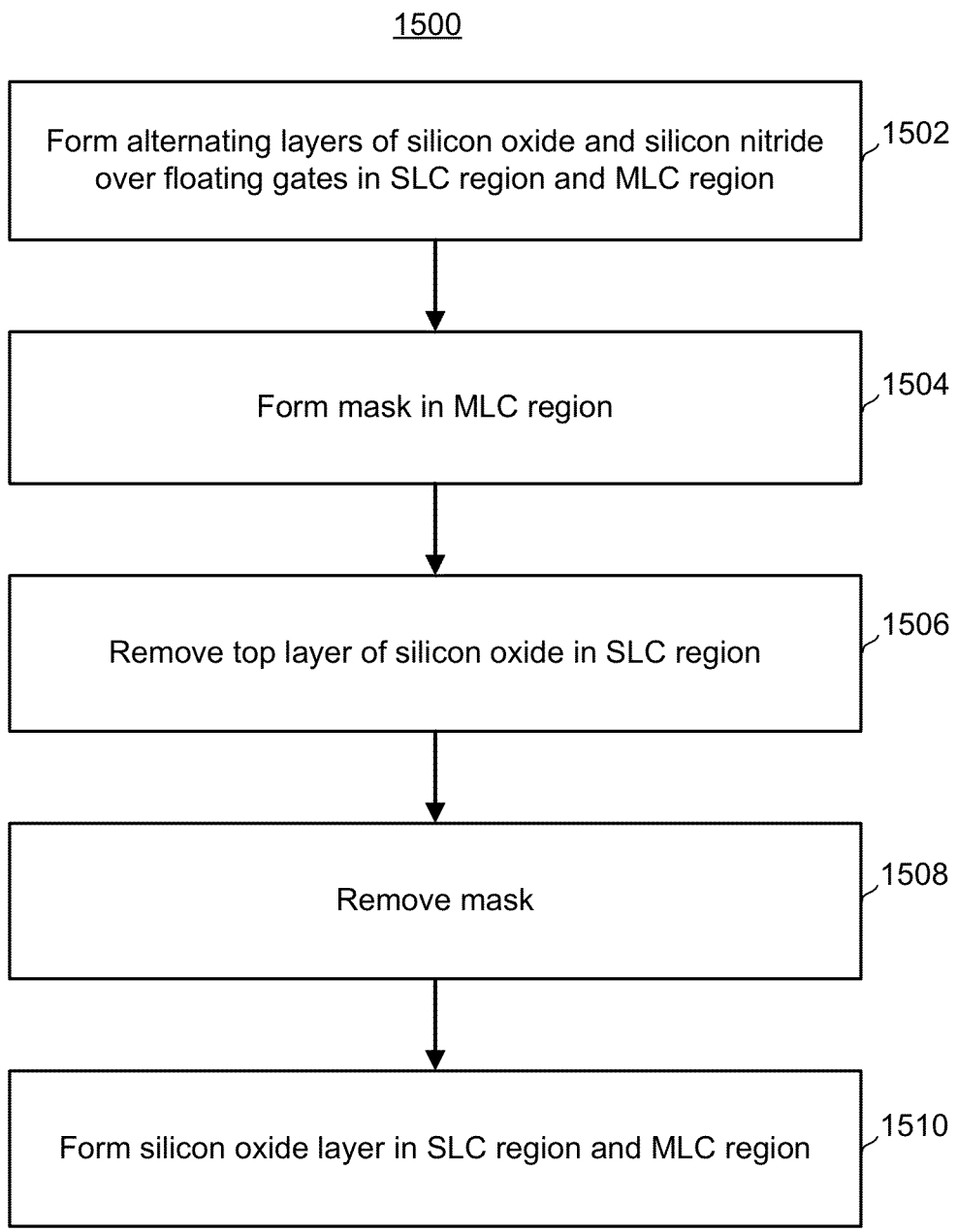
FIG. 15 is a flowchart of one embodiment of a process of forming an inter-gate dielectric in an SLC block having a different thickness from a tunnel oxide in an MLC block.

In one embodiment, the IPD is thinner in the SLC blocks than in the MLC blocks. FIG. 15 is a flowchart of one embodiment of a process of forming SLC blocks having a thinner IPD than the IPD in MLC blocks. Note that the IPD is not required to be thinner in the SLC blocks than the IPD in the MLC blocks in process 1200. In one embodiment, the IPD is thinner in the SLC blocks than in the MLC blocks and the tunnel oxide is thinner in the SLC blocks than in the MLC blocks.

In step 1230 of FIG. 12, the control gates 252 (word lines) are deposited. Step 1230 may include depositing a polysilicon layer, a Tungsten Silicide (WSi) layer and a Silicon Nitride (SiN) layer. When forming the control gates 252, photolithography is used to create patterns of strips perpendicular to NAND strings (e.g., perpendicular to the polysilicon strips from which the floating gates 702 are formed), in order form word lines that are isolated from one another. In step 1230, etching is performed using plasma etching, ion milling, ion etching that is purely physical etching, or another suitable process to etch the various layers and form the individual word lines. FIGS. 8A and 8B depict results for one embodiment of process 1200. FIGS. 10A and 10B depict results for one embodiment of process 1200.

FIG. 13 is a flowchart of one embodiment of a process 1300 of forming a tunnel oxide in an SLC block having a different thickness from a tunnel oxide in an MLC block. Process 1300 may be used to form storage elements such as the embodiments depicted in FIGS. 8A and 8B. Process 1300 may be used in one embodiment of steps 902 and 904 of process 900. Process 1300 is one embodiment of step 1202 of process 1200. FIGS. 14A-14D depict results after one embodiment of various steps of process 1300. One or more steps of process 1300 deliberately achieve a thinner tunnel oxide for storage elements in an SLC block 202*b* than for storage elements in an MLC block 202*a*.

In step 1302, a first layer of tunnel oxide is grown over a substrate in regions where SLC blocks and MLC blocks are being formed. In one embodiment, the first layer of tunnel oxide is $SiO_2$. FIG. 14A shows results after step 1302. FIG. 14A shows an oxide layer 1402 over a substrate 702. An MLC region and an SLC region are depicted to represent regions in which an MLC block 200*a* and an SLC block 200*b* are to be formed.

In step 1304, a mask is formed over the tunnel oxide in the MLC region. FIG. 14B shows results after step 1304. FIG. 14B shows mask 1404 over the oxide layer 1402 in the MLC region.

Figure 14C:
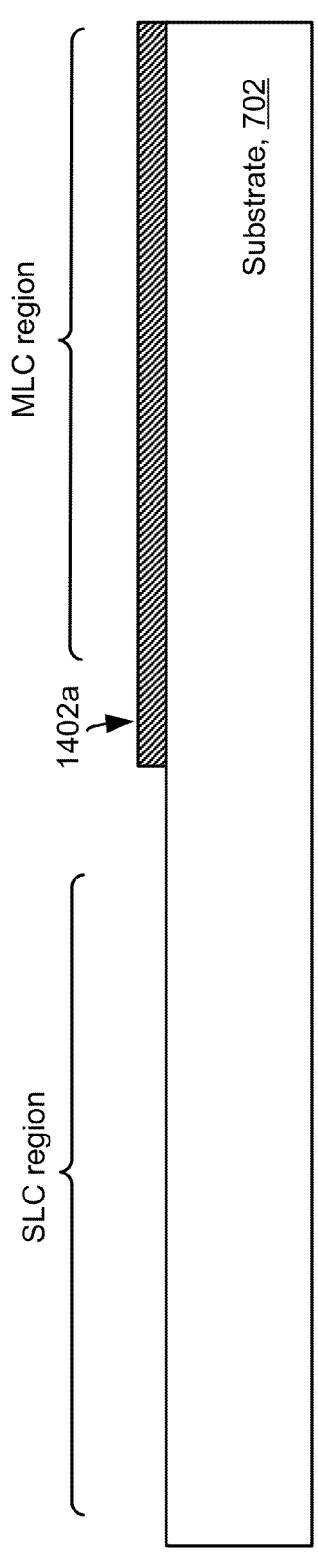

In step 1306, the oxide layer is removed in the SLC region. In step 1308, the mask is removed. FIG. 14C shows results after step 1308. FIG. 14C shows an oxide layer 1402*a* in the MLC region that remains after removing portions of the oxide layer 1402 from the SLC region.

Figure 14D:
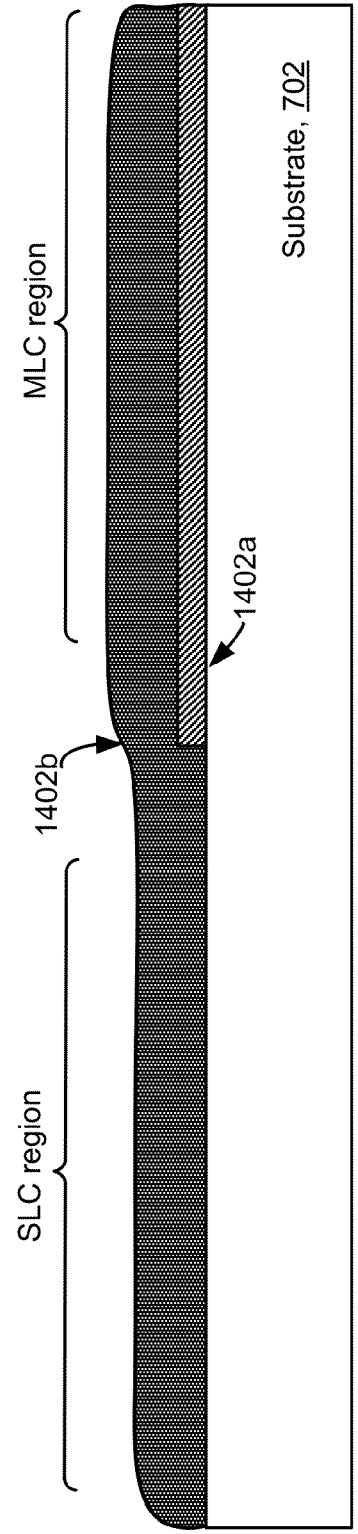

In step 1310, a second layer of oxide is grown in both the SLC region and the MLC region. In one embodiment, the second layer of tunnel oxide is $SiO_2$. The second layer of oxide is grown on the substrate 702 in the SLC region and on the first layer of oxide in the MLC region. The second layer may be grown such that it has the desired thickness for the non-volatile storage elements in the SLC region. The combined thickness of the first layer of oxide and the second layer of oxide may be such that they are the desired thickness for the non-volatile storage elements in the MLC region. FIG. 14D shows results after step 1310. FIG. 14D shows a second layer of oxide layer 1402*b*. The second layer of oxide 1402*b* may be in direct contact with the substrate 702 in the SLC region. The second layer of oxide 1402*b* may be in direct contact with the remaining first layer 1402*a* in the MLC region.

After process 1300, other process steps may be performed to arrive at storage elements such as the ones in an MLC block and an SLC block of FIGS. 8A and 8B, respectively. The combined thickness of oxide layers 1402*a* and 1402*b* may be the desired thickness for tunnel oxide 712*a* of storage elements in an MLC block (e.g., $t_a$ in FIG. 8A). The thickness of oxide layer 1402*b* may be the desired thickness for tunnel oxide 712*b* of storage elements in an SLC block (e.g., $t_b$ in FIG. 8B).

Figure 16B:
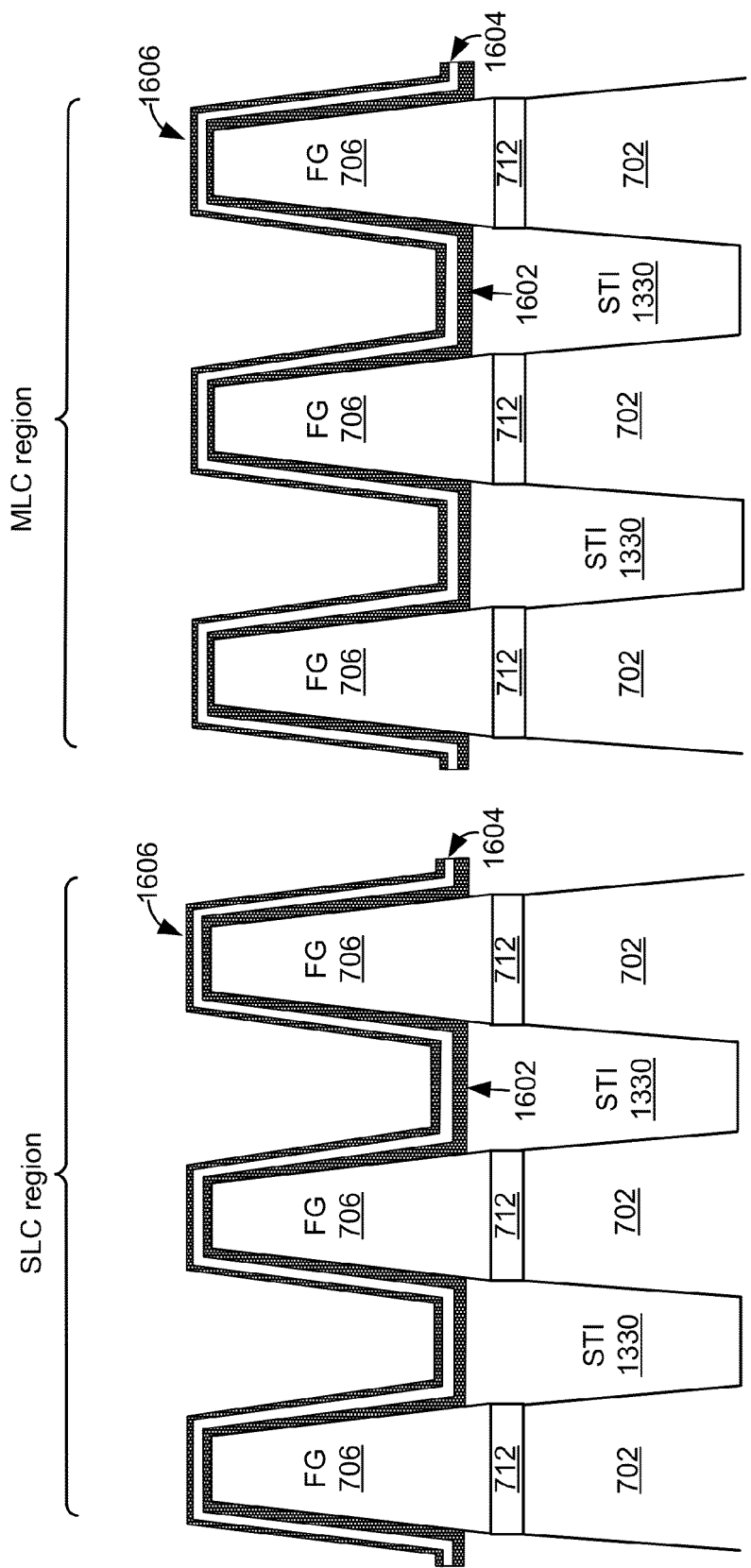
FIGS. 16B, 16C, and 16D depict results after various steps of one embodiment of the process of FIG. 15.
Figure 16C:
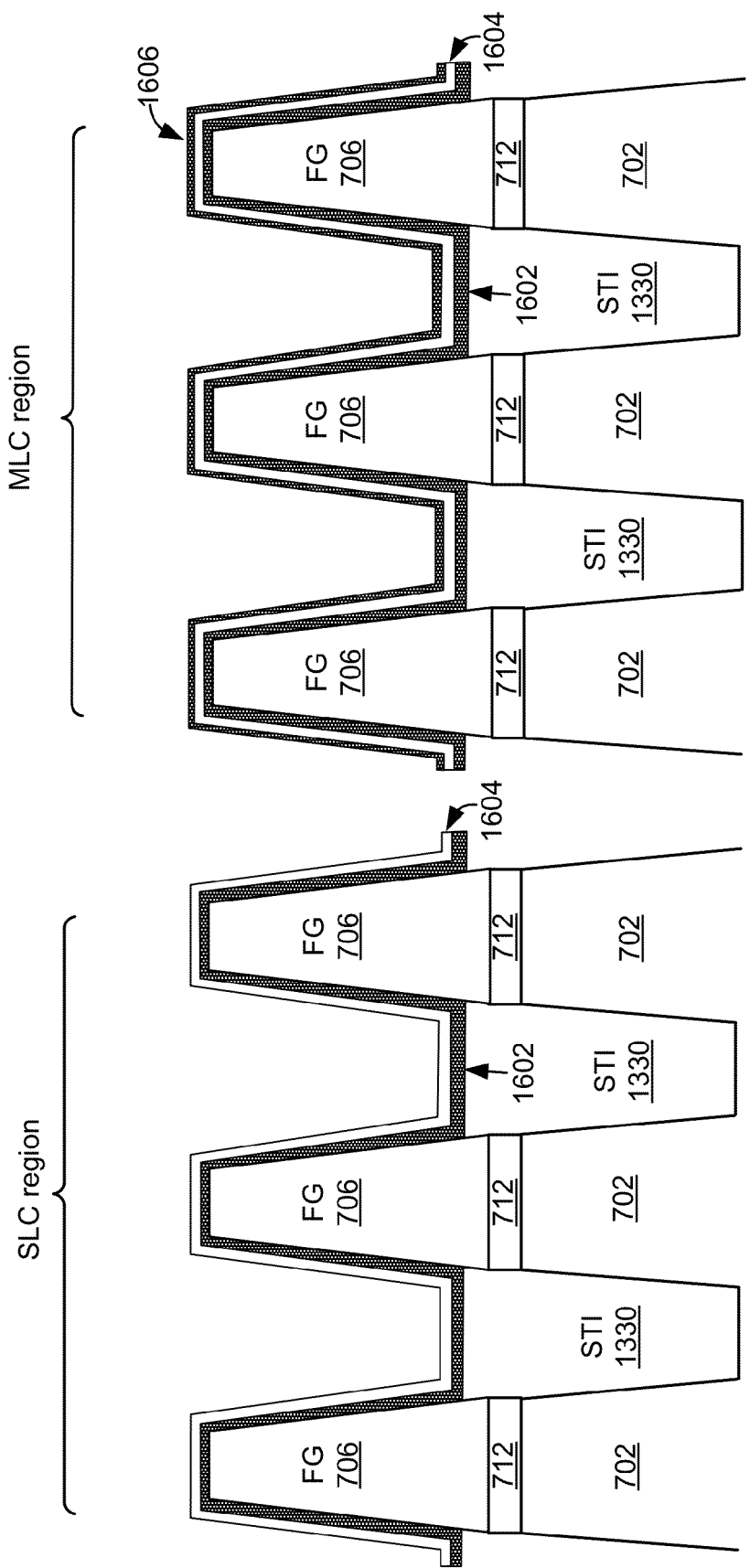
Figure 16D:
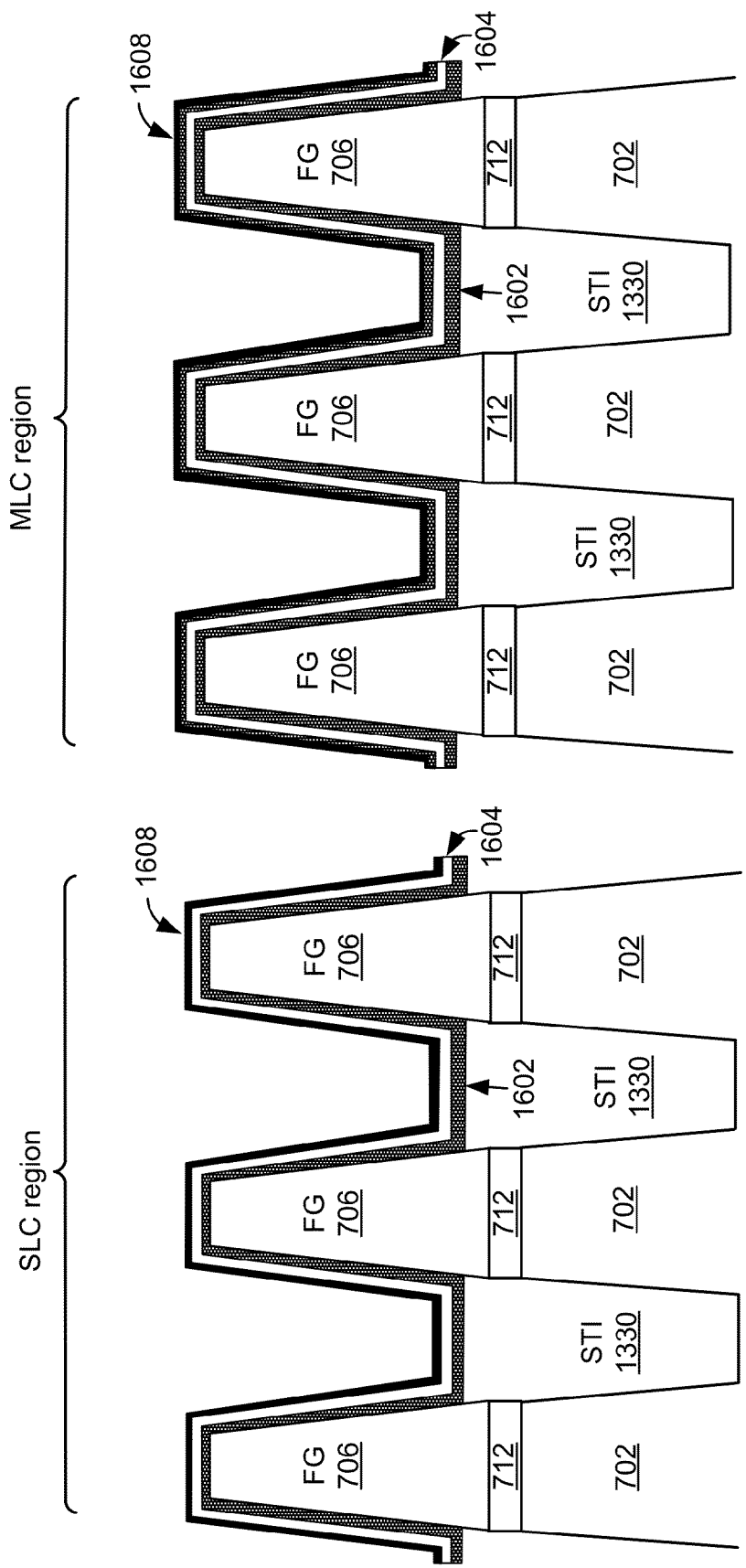

FIG. 15 is a flowchart of one embodiment of a process 1500 of forming an inter-gate dielectric in an SLC block 200*b* having a different thickness from a tunnel oxide in an MLC block 200*a*. Process 1500 may be used in to form storage elements such as the examples depicted in FIGS. 10A and 10B. Process 1500 may be used in one embodiment of steps 1102 and 1104 of process 1100. Process 1500 is one embodiment of step 1228 of process 1200. FIGS. 16B, 16C, and 16D depict results after various steps of one embodiment of the process of FIG. 15. One or more steps of process 1500 deliberately achieve a thinner inter-gate dielectric for storage elements in an SLC block 202*b* than for storage elements in an MLC block 202*a*.

Prior to process 1500, process 1200 could be performed up to step 1227. FIG. 16A depicts results after step 1227 of process 1200. FIG. 16A is a perspective along line B-B' of FIG. 2B, showing several FGs 706 being formed on adjacent NAND strings. These could be those being formed in either the SLC region or the MLC region. Each of the depicted floating gates 706 is one floating gate 706 in a NAND string. A tunnel oxide layer 712 resides between the floating gate 706 and substrate 702. Shallow trench isolation (STI) structures 1330 serve to provide electrical isolation between NAND strings. For example, the STI structures 1330 provide electrical isolation between source/drain regions and channels (not depicted in FIG. 16A). In one embodiment, the tunnel oxide 712 is about the same thickness in both the SLC region and the MLC region. In one embodiment, the tunnel oxide 712 is thinner in the SLC region than in the MLC region. In one embodiment, the FG 706 is about the same height in both the SLC region and the MLC region. In one embodiment, the FG 706 is shorter in the SLC region than in the MLC region.

In step 1502, alternating layers of silicon oxide and silicon nitride are formed over the floating gates in both the SLC region and the MLC region. In one embodiment, these are conformal layers over the FGs 706. The alternating layers may also be formed over the STI 1330. FIG. 16B depicts results after step 1502. FIG. 16B shows a first layer of silicon oxide 1602 formed over the floating gates 706. This may also be formed over the surface of the STI 1330. A first layer of silicon nitride 1604 is formed over the first layer of silicon oxide 1602. A second layer of silicon oxide 1606 is formed over first layer of silicon nitride 1604. Additional layers may be formed. In one embodiment, a second layer of layer of silicon nitride (not depicted in FIG. 16B) is formed over the second layer of silicon oxide 1606. In one embodiment, a third layer of layer of silicon oxide (not depicted in FIG. 16B) is formed over the second layer of silicon nitride (not depicted in FIG. 16B). Each of the layers in the SLC region may be about the same thickness as the corresponding layer in the MLC region, at this point in the process 1500. For example, the first layer of silicon nitride 1604 may be about the same thickness in both the SLC region and the MLC region.

In step 1504, a mask is formed in the MLC region over the alternating layers of silicon oxide and silicon nitride. Referring to FIG. 16B, a mask may be formed over the second layer of silicon oxide 1606. In this example, the second layer of silicon oxide 1606 is the top layer of the alternating layers. By the top layer it is meant the last layer that was formed.

In step 1506, the top layer of the alternating layers is removed, based on the mask. In step 1508, the mask is removed. FIG. 16C depicts results after step 1508. FIG. 16C shows that now the second layer of silicon oxide 1606 has been removed from the SLC region, but is still present in the MLC region. Note that the top layer that is removed is not necessarily the second layer of silicon oxide 1606. As noted, additional layers of alternating silicon oxide and silicon nitride may be formed. In one embodiment, the top layer that is removed from the SLC region is a second layer of silicon nitride. In one embodiment, the top layer that is removed from the SLC region is a third layer of silicon oxide. The top layer that is removed could be still another layer.

In step 1510, another layer of silicon oxide is formed in both the SLC region and the MLC region. FIG. 16D depicts results after step 1510. FIG. 16D shows the additional layer of silicon oxide 1608 in the SLC region and in the MLC region. In the SLC region, the additional layer 1608 may be in direct contact with the second layer of silicon nitride 1604. In the MLC region, the additional layer 1608 may be in direct contact with the second layer of silicon oxide 1606. In effect, the additional layer of silicon oxide 1608 may combine with the second layer of silicon oxide 1606 to form a thicker layer of silicon oxide in the MLC region than just the additional layer of silicon oxide 1608 in the SLC region. A net result of step 1510 is that the combined thickness of layers 1602, 1604 and 1608 in the SLC region is less than the combined thickness of layers 1602, 1604, 1606, and 1608 in the MLC region. In one embodiment, the combined thickness of layers 1602, 1604, and 1608 is the desired thickness of the IPD for non-volatile storage elements in an SLC block. In one embodiment, the combined thickness of layers 1602, 1604, 1606, and 1608 is the desired thickness of the IPD for non-volatile storage elements in an MLC block. However, the IPD may have additional layers of alternating silicon oxide and silicon nitride.

After step 1510, step 1230 of process 1200 may be performed to form control gates over the IPD.

Figure 17A:
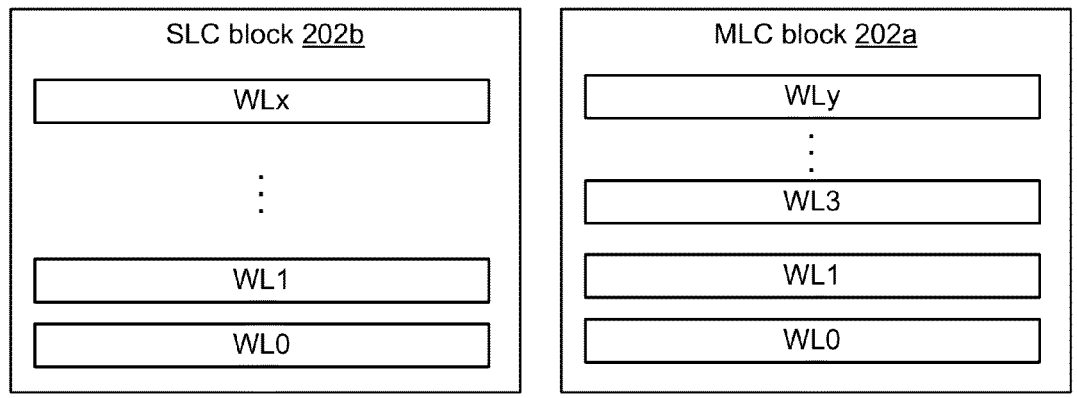
FIG. 17A depicts a diagram of one embodiment of an SLC block and an MLC block that have different numbers of data word lines.

In some embodiments, the SLC blocks 202b have a different number of data word lines than the MLC blocks 202a. FIG. 17A depicts a diagram of one embodiment of an SLC block 202b and an MLC block 202a that have different numbers of data word lines. In this embodiment, the SLC block 202b has exactly "x" data word lines and the MLC block 202a has exactly "y" data word lines. In one embodiment, "x" is a different integer than "y." The SLC block 202b may be dedicated to storing a single bit in each of the non-volatile storage elements in the SLC block 202b. There may be many such SLC blocks 202b and many such MLC blocks 202a in a memory array 200.

In one embodiment, the non-volatile storage elements are arranged as NAND strings in the SLC block 202b. In one embodiment, the non-volatile storage elements are arranged as NAND strings in the MLC block 202a. Because there are a different number of data word lines, there will be a different number of data storage elements on a NAND string. For example, there may be exactly "x" data storage elements per NAND string in the SLC block 202b. There may be exactly "y" data storage elements per NAND string in the MLC block 202a.

In one embodiment, one or more managing circuits are in communication with the data word lines in SLC block 202b and the data word lines in MLC block 202a. In one embodiment, the one or more managing circuits store "n" bits in each of the non-volatile storage elements in the MLC block 202a, wherein "n" is an integer greater than one, and wherein x=y*n. For example, if two bits are stored per storage element in the MLC block 202a, then there may be twice as many data word lines in the SLC block 202b than the MLC block 202a. As another example, if three bits are stored per storage element in the MLC block 202a, then there may be three times as many data word lines in the SLC block 202b than the MLC block 202a. As one further example, if four bits are stored per storage element in the MLC block 202a, then there may be four times as many data word lines in the SLC block 202b than the MLC block 202a. If the storage elements are arranged as NAND strings, then the foregoing may apply to the number of data storage elements on NAND strings in each block 202b, 202a.

In one embodiment, the non-volatile storage elements in the SLC block 202b of FIG. 17A have a thinner tunnel oxide 712b than the tunnel oxide 712a of non-volatile storage elements in the MLC block 202a. In one embodiment, the non-volatile storage elements in the SLC block 202b of FIG. 17A have a thinner IPD 708b than the IPD 708a of non-volatile storage elements in the MLC block 202a. In one embodiment, both the tunnel oxide and IPD are thinner for storage elements in the SLC block 202b than for storage elements in the MLC block 202a in FIG. 17A.

Figure 17B:
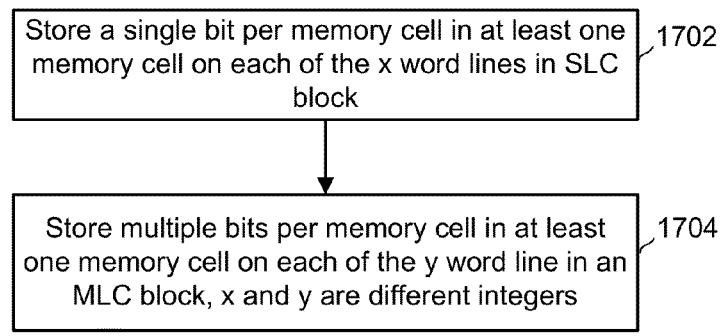
FIG. 17B is a flowchart of one embodiment of a process of storing data in SLC blocks and MLC blocks.

FIG. 17B is a flowchart of one embodiment of a process 1700 of storing data in SLC blocks 202b and MLC blocks 202a. FIG. 17B may be used in conjunction with one embodiment of FIG. 17A. In step 1702, a single bit is stored per non-volatile storage element in a single level cell (SLC) block in a memory array. In one embodiment, the SLC block 202b is dedicated to storing only one bit per non-volatile storage element. The SLC block 202b has exactly "x" data word lines, in one embodiment. Step 1702 may include writing to at least one non-volatile storage element associated with each of the data word lines in the SLC block 202b. Step 1702 may include writing to all data storage elements on each of the data word lines in the SLC block 202b.

In step 1704, multiple bits are stored per non-volatile storage element in a multi-level cell (MLC) block in the memory array. In one embodiment, the MLC block 202a includes exactly "y" data word lines, where "x" and "y" are different integers greater than zero. Step 1704 may include writing to at least one non-volatile storage element associated with each of the data word lines in the MLC block 202a. Step 1704 may include writing to all data storage elements on each of the data word lines in the MLC block 202a.

In one embodiment of process 1700, step 1702 includes filling the SLC block 202b and step 1704 includes transferring all of the data from the SLC block 202b to the MLC block 202a, which fills the MLC block 202a. By filling an SLC block it is meant that all data storage elements are written to. By filling an MLC block it is meant that at least two bits are stored in all data storage elements. For example, step 1702 may include writing data to all 128 data word lines in the SLC block 202b. Then, step 1704 may include writing data to all 64 data word lines in the MLC block 202a. In this example, the MLC block 202a may store two bits per storage element. Note that it is not required to fill the SLC block 202b prior to transferred data to the MLC block 202a. Also note that it is not required to transfer the data from the SLC block 202b to the MLC block 202a. For example, in some cases the data that is stored in an SLC block 202b may be erased without it ever being transferred to an MLC block 202a.

In one embodiment, the SLC blocks 202b have a relatively few number of data word lines. This may help to reduce or eliminate some problems that could occur during programming, as well as other times. For example, having a relatively few number of data word lines may improve boosting during programming. Also, read disturb may be less of an issue. Furthermore, Icell degradation may be less of a concern. In one embodiment, an SLC block 202b has a single data word line. In one embodiment, an SLC block 202b has two or fewer word lines. In one embodiment, an SLC block 202b has three or fewer word lines.

In one embodiment, the FG 706 in the SLC blocks 202b is shorter than the FG 706 in the MLC blocks 202a. A shorter FG 706 may reduce read disturb. A shorter FG height for SLC blocks may also improve yield for the SLC blocks because process reliability may be better for shorter FG height. As discussed above, the IPD and/or tunnel oxide may be thinner in the SLC blocks, which can allow for a lower Vpgm (which can help improve endurance). For some cell shapes, cells having a shorter FG 706 could potentially need a greater Vpgm because a shorter FG may reduce the coupling ratio between the CG 252 and the FG 706. However, since the Vpgm may be lowered by the thinner IPD and/or tunnel oxide, this can be taken advantage of to reduce read disturb without sacrificing endurance. Thus, in one embodiment, cells in SLC blocks have a shorter FG 706 than in MLC blocks, and also have a thinner IPD and/or tunnel oxide. In one embodiment, cells in SLC blocks have a shorter FG 706 than in MLC blocks, but do not necessarily have a thinner IPD and/or tunnel oxide.

There are many alternatives to the above described structures and processes within the spirit of the present invention. A wide variety of shapes may be used for floating gates 706. In some embodiments, the floating gates 706 have an inverted T-shape. In some embodiments, the floating gates 706 gradually become wider from top to bottom. Other shapes may be used for the floating gates 706. The control gates 252 may also have a variety of shapes. In one embodiment, the control gates 252 do not extend down between adjacent floating gates 706.

As in the existing NAND embodiments, an alternative is to fabricate the memory cells from PMOS devices with opposite polarity bias conditions for the various operations as compared to the existing NMOS implementation. In the above examples, the substrate is made of silicon. However, other materials known in the art can also be used such as Gallium Arsenide, etc.

One embodiment disclosed herein includes a non-volatile storage system comprising SLC blocks having non-volatile storage elements with a different tunnel oxide thickness than for storage elements in MLC blocks. The storage system comprises a memory array having a first block and a second block. The first block comprises a first plurality of non-volatile storage elements. Each storage element of the first plurality of non-volatile storage elements includes a first tunnel oxide having approximately a first thickness. The first block is dedicated to storing a single bit per non-volatile storage element. The second block comprises a second plurality of non-volatile storage elements. Each storage element of the second plurality of non-volatile storage elements includes a second tunnel oxide having approximately a second thickness that is greater than the first thickness. The second block is used to store multiple bits per non-volatile storage element. Substantially all of the first plurality of non-volatile storage elements have a thinner first tunnel oxide than the second thickness. Substantially all of the second plurality of non-volatile storage elements have a thicker second tunnel oxide than the first thickness.

One embodiment disclosed herein includes a method of fabricating a non-volatile storage device in which SLC blocks have non-volatile storage elements with a different tunnel oxide thickness than for storage elements in MLC blocks. The method comprises forming dedicated single level cell (SLC) blocks having first non-volatile storage elements in a first region of a memory array, which includes forming a first tunnel oxide for each of the first non-volatile storage elements having approximately a first thickness. The method also comprises forming multi-level cell (MLC) blocks having second non-volatile storage elements in a second region of the memory array, which includes forming a second tunnel oxide for each of the second non-volatile storage elements having approximately a second thickness that is greater than the first thickness. Forming the first tunnel oxide for each of the first non-volatile storage elements and forming the second tunnel oxide for each of the second non-volatile storage elements includes performing a process step to deliberately cause the second tunnel oxide to be thicker than the first tunnel oxide.

One embodiment includes a non-volatile storage device that is fabricated in accordance with the foregoing method of fabricating a non-volatile storage device in which SLC blocks have non-volatile storage elements with a different tunnel oxide thickness than for storage elements in MLC blocks.

One embodiment disclosed herein includes a non-volatile storage system comprising SLC blocks having non-volatile storage elements with a different inter-gate dielectric thickness than for storage elements in MLC blocks. The system comprises a memory array having a plurality of single level cell (SLC) blocks and a plurality of multi-level cell (MLC) blocks. The SLC blocks each comprise a first plurality of non-volatile storage elements. Each of the first plurality of non-volatile storage elements include a first floating gate, a first control gate, and a first inter-gate dielectric between the first floating gate and the first control gate. The first inter-gate dielectric for each of the first plurality of non-volatile storage elements has approximately a first thickness. The MLC blocks each comprise a second plurality of non-volatile storage elements. Each of the second plurality of non-volatile storage elements include a second floating gate, a second control gate, and a second inter-gate dielectric between the second floating gate and the second control gate. The second inter-gate dielectric for each of the second plurality of non-volatile storage elements has approximately a second thickness that is greater than the first thickness. Substantially all of the first plurality of non-volatile storage elements have a thinner first inter-gate dielectric than the second thickness and substantially all of the second plurality of non-volatile storage elements have a thicker second inter-gate dielectric than the first thickness, in one embodiment. The storage system further comprises one or more managing circuits in communication with the first plurality of non-volatile storage elements in each of the SLC blocks and the second plurality of non-volatile storage elements in each of the MLC blocks. The one or more managing circuits store only a single bit per non-volatile storage element in the SLC blocks. The one or more managing circuits store multiple bits per non-volatile storage element in the MLC blocks.

One embodiment disclosed herein includes a method of fabricating a non-volatile storage device in which SLC blocks have non-volatile storage elements with a different inter-gate dielectric thickness than for storage elements in MLC blocks. The method comprises forming a first plurality of blocks having first non-volatile storage elements in a first region of a memory array. The first non-volatile storage elements each include a first floating gate, a first control gate, and a first inter-gate dielectric between the first floating gate and the first control gate. The first inter-gate dielectric having a first thickness. The method also includes forming a second plurality of blocks having second non-volatile storage elements in a second region of the memory array. The second non-volatile storage elements each include a second floating gate, a second control gate, and a second inter-gate dielectric between the second floating gate and the second control gate. The second inter-gate dielectric having a second thickness that is thicker than the first thickness. The method may further comprise providing one or more managing circuits in communication with the first non-volatile storage elements and the second non-volatile storage elements. The one or more managing circuits are configured to store only a single bit in each of the first non-volatile storage elements in the first plurality of blocks. The one or more managing circuits are configured to store multiple bits in each of the second non-volatile storage elements in the second plurality of blocks. In one embodiment, forming the first plurality of blocks and forming the second plurality of blocks includes performing a process step to deliberately cause the second inter-gate dielectric to be thicker than the first inter-gate dielectric.

One embodiment includes a non-volatile storage device that is fabricated in accordance with the foregoing method of fabricating a non-volatile storage device in which SLC blocks have non-volatile storage elements with a different inter-gate dielectric thickness than for storage elements in MLC blocks.

One embodiment includes a non-volatile storage system in which SLC blocks have a different number of data word lines than MLC blocks. The system includes a memory array comprising a plurality of first blocks each having exactly "x" data word lines. The memory array comprises a plurality of second blocks each having exactly "y" data word lines, where "x" is an integer that is different from "y." Each of the first blocks comprises a first plurality of non-volatile storage elements associated with the "x" data word lines in the first block. Each of the second blocks comprises a second plurality of non-volatile storage elements associated with the "y" word lines in the second block. The plurality of first blocks may be dedicated to storing a single bit in each of the first plurality of non-volatile storage elements. The non-volatile storage system further includes one or more managing circuits in communication with the data word lines in the plurality of first blocks and the data word lines in the plurality of second blocks. The one or more managing circuits store a single bit in each of the first non-volatile storage elements. The one or more managing circuits store multiple bits in each of the second non-volatile storage elements.

One embodiment includes a method of operating non-volatile storage system. The method comprises storing a single bit per non-volatile storage element in a single level cell (SLC) block in a memory array. The SLC block is dedicated to storing only one bit per non-volatile storage element. The SLC block has exactly "x" data word lines. The storing includes writing to at least one non-volatile storage element associated with each of the data word lines in the SLC block. The method further comprises storing multiple bits per non-volatile storage element in a multi-level cell (MLC) block in the memory array. The MLC block includes exactly "y" data word lines, where "x" and "y" are different integers greater than zero. This storing includes writing to at least one non-volatile storage element associated with each of the data word lines in the MLC block.

One embodiment includes a non-volatile storage system, comprising a memory array having a first block and a second block. The first block comprises: a first plurality of non-volatile storage elements, each storage element of the first plurality of non-volatile storage elements including a first dielectric having approximately a first thickness. The first block is dedicated to storing a single bit per non-volatile storage element. The second block comprises: a second plurality of non-volatile storage elements. Each storage element of the second plurality of non-volatile storage elements including a second dielectric having approximately a second thickness that is greater than the first thickness. The second block is used to store multiple bits per non-volatile storage element. Substantially all of the first plurality of non-volatile storage elements have a thinner first dielectric than the second thickness. Substantially all of the second plurality of non-volatile storage elements have a thicker second dielectric than the first thickness. In one embodiment, the first dielectric is a tunnel oxide and the second dielectric is a tunnel oxide. In one embodiment, the first dielectric is an inter-gate dielectric and the second dielectric is an inter-gate dielectric.

One embodiment includes a method of fabricating a non-volatile storage device, comprising: forming dedicated single level cell (SLC) blocks having first non-volatile storage elements in a first region of a memory array, including forming a first dielectric for each of the first non-volatile storage elements having approximately a first thickness; and forming multi-level cell (MLC) blocks having second non-volatile storage elements in a second region of the memory array, including forming a second dielectric for each of the second non-volatile storage elements having approximately a second thickness that is greater than the first thickness. The forming a first dielectric for each of the first non-volatile storage elements and the forming a second dielectric for each of the second non-volatile storage elements includes performing a process step to deliberately cause the second dielectric to be thicker than the first dielectric. In one embodiment, the first dielectric is a tunnel oxide and the second dielectric is a tunnel oxide. In one embodiment, the first dielectric is an inter-gate dielectric and the second dielectric is an inter-gate dielectric.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A non-volatile storage system, comprising:
   a memory array having a first block of non-volatile storage elements and a second block of non-volatile storage elements above a substrate;
   wherein the non-volatile storage elements in the first block each comprise:
   a first charge storage region and a first tunnel oxide between the first charge storage region and the substrate, the first tunnel oxide having approximately a first thickness;
   wherein the non-volatile storage elements in the second block each comprise:
   a second charge storage region and a second tunnel oxide between the second charge storage region and the substrate, the second tunnel oxide having approximately a second thickness that is greater than the first thickness, wherein substantially all of the non-volatile storage elements in the first block have a thinner first tunnel oxide than the second thickness, substantially all of the nonvolatile storage elements in the second block have a thicker second tunnel oxide than the first thickness; and one or more managing circuits in communication with the non-volatile storage elements in the first and second blocks, the one or more managing circuits are configured to store only a single bit in each of the non-volatile storage elements in the first block, the one or more managing circuits are configured to store multiple bits in each of the non-volatile storage elements in the second block, wherein each of the non-volatile storage elements in the first block further includes a first control gate and a first inter-gate dielectric between the first charge storage region and the first control gate, the first inter-gate dielectric of each of the non-volatile storage elements in the first block having approximately a third thickness, each of the non-volatile storage elements in the second block includes a second control gate and a second inter-gate dielectric between the second charge storage region and the second control gate, the second inter-gate dielectric having approximately a fourth thickness that is greater than the third thickness, substantially all of the non-volatile storage elements in the second block have a thicker inter-gate dielectric than the third thickness, substantially all of the non-volatile storage elements in the first block have a thinner inter-gate dielectric than the fourth thickness.

2. The non-volatile storage system of claim 1, wherein the first block consists of a first number of data word lines associated with the non-volatile storage elements in the first block, the second block consists of a second number of data word lines associated with the non-volatile storage elements in the second block, the second number of data word lines is different from the first number of data word lines.

3. The non-volatile storage system of claim 2, wherein:
the one or more managing circuits are configured to store "n" bits in each of the non-volatile storage elements in the second block, wherein "n" is an integer greater than one, the first number of data word lines is "n" times the second number of data word lines.

4. The non-volatile storage system of claim 1, wherein the first charge storage region is a first floating gate having approximately a first height, the second charge storage region is a second floating gate having approximately a second height that is greater than the first height.

5. The non-volatile storage system of claim 1, wherein the non-volatile storage elements in the first block are arranged as a first plurality of NAND strings, the non-volatile storage elements in the second block are arranged as a second plurality of NAND strings, the first tunnel oxide of substantially all of the non-volatile storage elements of the first plurality of NAND strings have the first thickness, the second tunnel oxide of substantially all of the non-volatile storage elements of the second plurality of NAND strings have the second thickness.

6. A non-volatile storage system, comprising:
a memory array having a plurality of single level cell (SLC) blocks and a plurality of multi-level cell (MLC) blocks;
the SLC blocks each comprising:
a first plurality of non-volatile storage elements, each of the first plurality of non-volatile storage elements including a first floating gate, a first control gate, and a first inter-gate dielectric between the first floating gate and the first control gate, the first inter-gate dielectric for each of the first plurality of non-volatile storage elements having approximately a first thickness; the MLC blocks each comprising:

a second plurality of non-volatile storage elements, each of the second plurality of non-volatile storage elements including a second floating gate, a second control gate, and a second inter-gate dielectric between the second floating gate and the second control gate, the second inter-gate dielectric for each of the second plurality of non-volatile storage elements having approximately a second thickness that is greater than the first thickness, substantially all of the first plurality of non-volatile storage elements have a thinner first inter-gate dielectric than the second thickness, substantially all of the second plurality of non-volatile storage elements have a thicker second inter-gate dielectric than the first thickness; and one or more managing circuits in communication with the first plurality of non-volatile storage elements in each of the SLC blocks and the second plurality of non-volatile storage elements in each of the MLC blocks, the one or more managing circuits store only a single bit per non-volatile storage element in the SLC blocks, the one or more managing circuits store multiple bits per non-volatile storage element in the MLC blocks.

7. The non-volatile storage system of claim 6, wherein the first plurality of non-volatile storage elements in each of the SLC blocks are arranged as NAND strings, the second plurality of non-volatile storage elements in each of the MLC blocks are arranged as NAND strings.

8. A method of operating non-volatile storage system, comprising:
storing a single bit per non-volatile storage element in a single level cell (SLC) block in a memory array, the SLC block is dedicated to storing only one bit per non-volatile storage element, the SLC block has exactly "x" data word lines, the storing includes writing to non-volatile storage elements associated with each of the data word lines in the SLC block, wherein the storing a single bit per non-volatile storage element fills the SLC block; and
storing multiple bits per non-volatile storage element in a multi-level cell (MLC) block in the memory array, the MLC block includes exactly "y" data word lines, "x" and "y" are different integers greater than zero, the storing includes writing to non-volatile storage elements associated with each of the data word lines in the MLC block, wherein storing multiple bits per non-volatile storage element includes transferring all of the data from the SLC block to the MLC block, which fills the MLC block.

9. The method of claim 8, wherein the storing multiple bits per non-volatile storage element in a multi-level cell (MLC) block includes:
storing n bits per non-volatile storage element in the MLC block, wherein "n" is an integer greater than one, wherein x=y*n.

10. The method of claim 8, wherein the non-volatile storage elements in the SLC block are arranged as NAND strings, the non-volatile storage elements in the MLC block are arranged as NAND strings.

11. The non-volatile storage system of claim 6, wherein the memory array is three dimensional.

12. The non-volatile storage system of claim 1, wherein the charge storage region of the non-volatile storage elements in the first and second blocks comprises a non-conductive dielectric material.

13. A method of operating non-volatile storage system, comprising:
storing a single bit per non-volatile storage element of NAND strings in a single level cell (SLC) block in a memory array, the SLC block has exactly "x" data storage elements per NAND string, the storing includes writing to all non-volatile storage elements associated with a first of the NAND strings in the SLC block; and storing multiple bits per non-volatile storage element in a multi-level cell (MLC) block in the memory array, the MLC block includes exactly "y" data storage elements per NAND string, "x" and "y" are different integers greater than zero, the storing includes writing to all non-volatile storage elements associated with a first of the NAND strings in the MLC block, wherein the writing to all non-volatile storage elements associated with the first NAND string in the MLC block includes transferring all of the data from the non-volatile storage elements of the first NAND string in the SLC block to the non-volatile storage elements of the first NAND string in the MLC block, which fills the first NAND string in the MLC block.

* * * * *